United States Patent
Elliott et al.

(10) Patent No.: US 7,514,015 B2
(45) Date of Patent: Apr. 7, 2009

(54) METHOD FOR SURFACE CLEANING

(75) Inventors: David J. Elliott, Wayland, MA (US); Ronald P. Millman, Jr., Taunton, MA (US); Murray Tardif, Townsend, MA (US); Krista Aiello, Hudson, NH (US)

(73) Assignee: UVTech Systems, Sudbury, MA (US)

( * ) Notice: Subject to any disclaimer, the term of this patent is extended or adjusted under 35 U.S.C. 154(b) by 716 days.

(21) Appl. No.: 10/998,465

(22) Filed: Nov. 29, 2004

(65) Prior Publication Data

US 2005/0279380 A1 Dec. 22, 2005

Related U.S. Application Data

(62) Division of application No. 10/870,646, filed on Jun. 17, 2004, now abandoned.

(51) Int. Cl.
*H01L 21/00* (2006.01)
*C23C 14/00* (2006.01)
*C23C 16/00* (2006.01)

(52) U.S. Cl. ............... 216/65; 216/60; 216/63; 216/66; 219/121.6; 219/121.85; 204/157.22; 156/345.5

(58) Field of Classification Search ............... 219/121.6, 219/121.85; 204/157.22; 216/65, 60, 63, 216/66; 156/345.1, 345.5
See application file for complete search history.

(56) References Cited

U.S. PATENT DOCUMENTS

| | | | |
|---|---|---|---|
| 1,081,950 A | 12/1913 | Eller et al. | |
| 1,901,803 A | 3/1933 | Davis | |
| 2,443,373 A | 6/1948 | Borsoff | 134/20 |
| 3,464,534 A | 9/1969 | Muncheryan | 197/181 |
| 3,626,141 A | 12/1971 | Daly | 219/121 |
| 3,649,806 A | 3/1972 | Konig | 219/121 |
| 3,664,899 A | 5/1972 | Wright et al. | 156/8 |
| 3,767,490 A | 10/1973 | Alberts | 156/2 |
| 3,866,398 A | 2/1975 | Vernon, Jr. et al. | 156/17 |
| 3,890,176 A | 6/1975 | Bolon | 156/2 |
| 4,028,135 A | 6/1977 | Vig et al. | 134/1 |
| 4,341,592 A | 7/1982 | Shortes et al. | 156/643 |
| 4,350,563 A | 9/1982 | Takada et al. | 156/643 |

(Continued)

FOREIGN PATENT DOCUMENTS

JP 60-242123 5/1987

(Continued)

OTHER PUBLICATIONS

Ultraviolet/Ozone Cleaning. [retrieved on Jul. 8, 2004][Retrieved from the Internet <URL: http://www.cleantechcentral.com/KnowledgeBase/TechnologySpotlight/ultraviolet.asp>.

(Continued)

*Primary Examiner*—Ram N. Kackar

(57) ABSTRACT

A system for removing photoresist from semiconductor wafers is disclosed. The system utilizes a solid-state laser having wavelengths in the near-visible and visible portions of the electromagnetic spectrum to remove photoresist without requiring hazardous gases or wet solutions. In addition, the system does not damage the substrate being cleaned, nor leave a carbon residue requiring further processing to remove. The system uses photon energy, oxygen, water vapor and ozone to interact with contaminants on a surface, forming a gas reaction zone (GRZ). The GRZ reacts and completely removes the photoresist or other unwanted contamination.

18 Claims, 25 Drawing Sheets

U.S. PATENT DOCUMENTS

| | | | | |
|---|---|---|---|---|
| 4,414,059 A | 11/1983 | Blum et al. | | 156/659.1 |
| 4,417,948 A | 11/1983 | Mayne-Banton et al. | | 156/643 |
| 4,501,061 A | 2/1985 | Wonnascott | | 29/591 |
| 4,508,749 A | 4/1985 | Brannon et al. | | 427/43.1 |
| 4,568,632 A | 2/1986 | Blum et al. | | 430/322 |
| 4,671,848 A | 6/1987 | Miller et al. | | 156/643 |
| 4,687,544 A | 8/1987 | Bersin | | 156/643 |
| 4,718,974 A | 1/1988 | Minaee | | 156/643 |
| 4,731,158 A | 3/1988 | Brannon | | 156/643 |
| 4,786,358 A | 11/1988 | Yamazaki et al. | | 156/643 |
| 4,812,201 A | 3/1989 | Sakai et al. | | 156/643 |
| 4,861,424 A | 8/1989 | Fujimura et al. | | 156/643 |
| 4,861,732 A | 8/1989 | Fujimura et al. | | 437/229 |
| 4,877,644 A | 10/1989 | Wu et al. | | 427/53.1 |
| 4,885,047 A | 12/1989 | Ury et al. | | 156/345 |
| 4,938,839 A | 7/1990 | Fujimura et al. | | 156/628 |
| 4,940,505 A | 7/1990 | Schachameyer et al. | | |
| 4,948,937 A | 8/1990 | Blank et al. | | 219/121.6 |
| 4,980,022 A | 12/1990 | Fujimura et al. | | 156/643 |
| 4,980,536 A | 12/1990 | Asch et al. | | 219/121.68 |
| 5,007,983 A | 4/1991 | Lerner et al. | | 156/643 |
| 5,024,968 A | 6/1991 | Engelsberg | | 437/173 |
| 5,037,506 A | 8/1991 | Gupta | | 156/646 |
| 5,044,314 A | 9/1991 | McNeilly | | 118/715 |
| 5,057,187 A | 10/1991 | Shinagawa et al. | | 156/643 |
| 5,071,485 A * | 12/1991 | Matthews et al. | | 134/2 |
| 5,099,557 A | 3/1992 | Engelsberg | | 29/25.01 |
| 5,114,834 A | 5/1992 | Nachshon | | 430/329 |
| 5,151,134 A | 9/1992 | Boquillon et al. | | 134/1 |
| 5,151,135 A | 9/1992 | Magee et al. | | 134/1 |
| 5,160,404 A | 11/1992 | Motoyama | | 156/643 |
| 5,174,856 A | 12/1992 | Hwang et al. | | 156/643 |
| 5,176,782 A | 1/1993 | Ishibashi et al. | | 156/345 |
| 5,178,721 A | 1/1993 | Sugino | | 156/626 |
| 5,200,031 A | 4/1993 | Latchford et al. | | 156/659.1 |
| 5,215,592 A | 6/1993 | Jackson | | 134/1 |
| 5,217,559 A | 6/1993 | Moslehi et al. | | 156/345 |
| 5,221,424 A | 6/1993 | Rhoades | | 156/643 |
| 5,228,206 A | 7/1993 | Grant et al. | | 34/1 |
| 5,246,526 A | 9/1993 | Yamaguchi et al. | | 156/345 |
| 5,261,965 A | 11/1993 | Moslehi | | 134/1 |
| 5,262,279 A | 11/1993 | Tsang et al. | | 430/311 |
| 5,304,173 A | 4/1994 | Kittrell et al. | | 606/15 |
| 5,310,703 A | 5/1994 | Visser et al. | | 437/229 |
| 5,312,396 A | 5/1994 | Feld et al. | | 606/11 |
| 5,346,586 A | 9/1994 | Keller | | 156/656 |
| 5,382,316 A | 1/1995 | Hills et al. | | 156/643 |
| 5,417,826 A | 5/1995 | Blalock | | 204/176 |
| 5,494,526 A | 2/1996 | Paranjpe | | 134/1 |
| 5,498,308 A | 3/1996 | Kamarehi et al. | | 156/345 |
| 5,503,708 A | 4/1996 | Koizumi et al. | | 156/643.1 |
| 5,504,391 A | 4/1996 | Turner et al. | | 313/570 |
| 5,522,938 A | 6/1996 | O'Brien | | 134/1 |
| 5,580,421 A | 12/1996 | Hiatt | | 150/643.1 |
| 5,628,871 A | 5/1997 | Shinagawa | | 438/514 |
| 5,630,904 A | 5/1997 | Aoyama et al. | | 438/669 |
| 5,669,979 A * | 9/1997 | Elliott et al. | | 134/1 |
| 5,677,113 A | 10/1997 | Suzuki et al. | | 430/329 |
| 5,709,754 A * | 1/1998 | Morinville et al. | | 134/1.3 |
| 5,709,757 A | 1/1998 | Hatano et al. | | 134/22.14 |
| 5,716,495 A | 2/1998 | Butterbaugh et al. | | 156/643.1 |
| 5,747,387 A | 5/1998 | Koizumi et al. | | 438/708 |
| 5,795,831 A | 8/1998 | Nakayama et al. | | 438/714 |
| 5,811,358 A | 9/1998 | Tseng et al. | | 438/725 |
| 5,814,156 A | 9/1998 | Elliott et al. | | 134/1 |
| 5,824,604 A | 10/1998 | Bar-Gadda | | 438/725 |
| 5,874,011 A * | 2/1999 | Ehrlich | | 216/65 |
| 5,882,489 A | 3/1999 | Bersin et al. | | 204/192.35 |
| 5,908,319 A | 6/1999 | Xu et al. | | 438/725 |
| 5,908,510 A | 6/1999 | McCullough et al. | | 134/2 |
| 5,925,501 A | 7/1999 | Zhang et al. | | 430/313 |
| 5,943,351 A | 8/1999 | Zhou et al. | | 372/22 |
| 5,956,596 A | 9/1999 | Jang et al. | | 438/401 |
| 5,958,268 A | 9/1999 | Engelsberg et al. | | 219/121.84 |
| 5,965,042 A | 10/1999 | Saitoh | | 219/121.68 |
| 6,009,888 A | 1/2000 | Ye et al. | | 134/1.3 |
| 6,024,801 A | 2/2000 | Wallace et al. | | 134/1 |
| 6,024,887 A | 2/2000 | Kuo et al. | | 216/48 |
| 6,027,960 A | 2/2000 | Kusumoto et al. | | 438/166 |
| 6,066,032 A | 5/2000 | Borden et al. | | 451/80 |
| 6,067,728 A | 5/2000 | Farmer et al. | | 34/470 |
| 6,105,588 A | 8/2000 | Li et al. | | 134/1.1 |
| 6,143,477 A | 11/2000 | Rhieu | | 430/329 |
| 6,165,279 A | 12/2000 | Tsao et al. | | 134/3 |
| 6,217,665 B1 | 4/2001 | Suzuki | | 134/1 |
| 6,240,933 B1 | 6/2001 | Bergman | | 134/1.3 |
| 6,273,099 B1 | 8/2001 | Chang et al. | | 134/1.3 |
| 6,277,733 B1 | 8/2001 | Smith | | 438/636 |
| 6,281,135 B1 | 8/2001 | Han et al. | | 438/725 |
| 6,288,773 B2 | 9/2001 | Johnson et al. | | 355/77 |
| 6,291,796 B1 * | 9/2001 | Lu et al. | | 219/121.68 |
| 6,306,564 B1 | 10/2001 | Mullee | | 430/329 |
| 6,333,268 B1 | 12/2001 | Starov et al. | | 438/691 |
| 6,343,400 B1 | 2/2002 | Massholder et al. | | 15/105 |
| 6,346,253 B2 | 2/2002 | Takaoka et al. | | 424/400 |
| 6,350,391 B1 | 2/2002 | Livshits et al. | | |
| 6,352,936 B1 | 3/2002 | Jehoul et al. | | 438/712 |
| 6,352,937 B1 | 3/2002 | Kadomura et al. | | 438/725 |
| 6,358,676 B1 | 3/2002 | Wu | | 430/329 |
| 6,362,110 B1 | 3/2002 | Marks | | 438/711 |
| 6,374,834 B1 | 4/2002 | Abe et al. | | 134/1.3 |
| 6,394,105 B1 | 5/2002 | Boszormenyi et al. | | 134/1.3 |
| 6,406,836 B1 | 6/2002 | Mohondro et al. | | 430/329 |
| 6,413,877 B1 | 7/2002 | Annapragada | | 438/723 |
| 6,419,996 B2 | 7/2002 | Mueller et al. | | 427/554 |
| 6,427,705 B1 | 8/2002 | Chang et al. | | 134/58 R |
| 6,457,478 B1 | 10/2002 | Danese | | 134/1.3 |
| 6,465,374 B1 | 10/2002 | Butterbaugh et al. | | 438/795 |
| 6,494,217 B2 | 12/2002 | Thompson et al. | | 134/1.3 |
| 6,500,268 B1 | 12/2002 | Henley | | 134/1 |
| 6,500,766 B2 | 12/2002 | Lu et al. | | 438/706 |
| 6,503,333 B2 | 1/2003 | Twu et al. | | 134/3 |
| 6,503,693 B1 | 1/2003 | Mohondro et al. | | 430/328 |
| 6,521,466 B1 | 2/2003 | Castrucci | | 438/5 |
| 6,524,936 B2 * | 2/2003 | Hallock et al. | | 438/531 |
| 6,526,996 B1 | 3/2003 | Chang et al. | | 134/1.3 |
| 6,533,902 B1 | 3/2003 | Miki et al. | | 204/157.15 |
| 6,548,416 B2 | 4/2003 | Han et al. | | 438/710 |
| 6,551,409 B1 | 4/2003 | DeGendt et al. | | 134/2 |
| 6,579,810 B2 | 6/2003 | Chang | | 438/745 |
| 6,588,437 B1 | 7/2003 | Higashi | | 134/148 |
| 6,597,003 B2 | 7/2003 | Janos et al. | | 250/492.2 |
| 6,602,349 B2 | 8/2003 | Chandra et al. | | 134/19 |
| 6,605,226 B2 | 8/2003 | Wang et al. | | 216/12 |
| 6,612,317 B2 | 9/2003 | Costantini et al. | | 134/58 R |
| 6,622,398 B2 | 9/2003 | Thomas | | 34/278 |
| 6,627,846 B1 * | 9/2003 | Yogev et al. | | 219/121.85 |
| 6,628,078 B2 | 9/2003 | Inayoshi | | 313/607 |
| 6,629,538 B2 | 10/2003 | Yokogawa et al. | | 134/1.2 |
| 6,630,406 B2 | 10/2003 | Waldfried et al. | | 438/710 |
| 6,635,938 B1 | 10/2003 | Nakahata et al. | | 257/382 |
| 6,638,875 B2 | 10/2003 | Han et al. | | 438/725 |
| 6,647,994 B1 | 11/2003 | Lui et al. | | 134/1.2 |
| 6,683,312 B2 | 1/2004 | Yun | | 250/455.1 |
| 2002/0023670 A1 | 2/2002 | Shiramizu et al. | | 134/104.1 |
| 2002/0170891 A1 | 11/2002 | Boyle et al. | | |
| 2002/0190037 A1 * | 12/2002 | Steur et al. | | 219/121.71 |
| 2003/0070690 A1 | 4/2003 | Danese | | 134/1.3 |
| 2003/0145875 A1 | 8/2003 | Han et al. | | 134/9 |

FOREIGN PATENT DOCUMENTS

| | | |
|---|---|---|
| JP | 1-233728 A | 9/1989 |
| JP | 02-146724 A | 6/1990 |

| | | |
|---|---|---|
| WO | 96/06692 A1 | 3/1996 |
| WO | 96/06693 A1 | 3/1996 |
| WO | WO 96/06694 | 3/1996 |
| WO | WO 97/17166 | 5/1997 |

OTHER PUBLICATIONS

Mikulan, P.I. et al., "An Assessment of Damage Resulting from Resist Stripping," Proc. Of the Symposium on Highly Selective Dry Etching and Damage Control, 93-21: 396-402 (1993).

Higashi, Gregg S. et al., "Surface Chemical Cleaning and Passivation for Semiconductor Processing," Materials Research Society Symposium Proceedings, 315: 237-242 (Apr. 13-15, 1993).

Chaudhary, Nirmal et al., "Damage Free, All-Dry Via. Etch Resist and Residue Removal Processes," (Technical Paper TP/970302). Mattson Technology, Inc., Fremont, CA (Jul. 1997).

Zafonte, Leo and Chiu, Rafael, "UV/Ozone Cleaning for Organics Removal on Silicon Wafers," SPIE, 470: 164-175 (1984).

FusionES3 Summary Specification, 56920 Rev. A, Eaton Corporation, Rockville, MD (Mar. 2000).

FusionGemini ES Summary Specification, 56940 Rev. A, Eaton Corporation, Rockville, MD (Mar. 2000).

FusionGemini Plasma Asher Summary Specification, 56930 Rev. A, Eaton Corporation, Rockville, MD (Mar. 2000).

Mount, David J. et al., "The Technology behind Cleaning with Supercritical Fluids," Solid State Technology, 103-106 (Jul. 2002).

"Laser Technique Cleans Polymers," Technology News Clean Processing, Maria A. Lester, Assoc. Ed., Semiconductor International, 54 (Apr. 1999).

Biberger, Maximilian A. et al., "Photoresist and Photoresist Residue Removal with Supercritical $CO_2$—a Novel Approach to Cleaning Wafers," Semiconductor Fabtech—$12^{th}$ Ed., 239-243 (Jul. 2000).

Bersin, R.L. et al., "Residue-Free Dry Stripping Photoresist Without Solvents or Acids: Time for a Paradigm Shift," Semiconductor Fabtech—$6^{th}$ Ed., 341-347 (May 1997).

Bergman, Eric et al., "Photoresist Strip Process Using Ozone Diffusion through a Controlled Aqueous Boundary Layer," Electrochemical Society Proceedings, 99-36: 399-406 (Fall 1999).

Park, H.-H. et al., "Effects of Post Etch Treatments on Contaminated Silicon Surface Due to $CHF_3/C_2F_6$ Reactive Ion Etching," Mat. Res. Soc. Symp. Proc., 315: 243-248 (1993).

Huynh, Cuc K. and Mitchener, James C., "Plasma versus Ozone Photoresist Ashing: Temperature Effects on Process-induced Mobile Ion Contamination," J. Vac. Sci. Technol., B9(2): 353-356 (Mar./Apr. 1991).

Zapka, W. and Ziemilch, W., "Efficient Pulsed Laser Removal of 0.2 μm Sized Particles from a Solid Surface," Appl. Phys. Lett., 58 (20): 2217-2219 (May 20, 1991).

DeLarios, J. et al., "Gas-Phase Cleaning of Trace Metal and Organic Contaminants from Wafers: Ultraviolet Irradiated Oxygen-Based and Chlorine-Based Chemistries," Micro92 Proceedings, 706-717 (Oct. 27-30, 1992).

Ruzyllo, Jerzy et al., Research Proposal on: Studies of Gas-Phase Cleaning of Silicon Surfaces Phase II, for consideration by Semiconductor Research Corporation, Research Triangle Park, NC, SRC Contract #92-MJ-274 (May 10, 1993).

Alder, Marilyn Grace and Hill, George Richard, "The Kinetics and Mechanism of Hydroxide Ion Catalyzed Ozone Decomposition in Aqueous Solution," Journal of the American Chemical Society, 72: 1884-1886 (May 1950).

Sykes, N. et al., "Laser Cleaning of Hard Disks and Bare Si Wafers," Proc. Of the Symposium on Dry Process, Japanese Laser Processing Society, 42: 113-119 (1997).

Ito, T. et al., "Photochemical Cleaning of Silicon Wafers with Halogen Radicals," Proceedings of the Symposium on Dry Process, 88-7: 287-292 (1988).

"Membrane Purifies Wet Etch and Clean Processes," Technology News Clean Processing, Semiconductor International, Maria A. Lester, Assoc. Ed., 38 (May 2003).

Dopp, Doug et al., "Manufacturing Qualification of an All-dry Via Deveil Plasma Process," 197th Electrochemical Society Meeting, Toronto, Canada (May 2000).

"Single-Wafer Cleaning vs. Batch Cleaning," Technology News Clean Processing, Semiconductor International, Maria A. Lester, Assoc. Ed., 52 (Aug. 2001).

Hawthorne, Rick, "Surface Analysis Report re. SIMS Analysis of Carbon Layer Remaining after Laser Broom," facsimile transmissions to UVTech from Micron Technology, Inc., analysis performed Sep. 15, 1995.

"Has Dry Cleaning Come of Age?" Semiconductor International, Maria A. Lester, Assoc. Ed., 40 (Mar. 1999).

Clean Processing, Single-Wafer Cleaning vs. Batch Cleaning, Semiconductor International (Aug. 2001).

Wang, Ying, "Simulation of Corduroy Patterns," UVTech/Novellus Internal Report (Aug. 1, 2001).

Handbook of Semiconductor Wafer Cleaning Technology Science Technology and Applications, Werner Kern, ed. (Westwood, NJ: Noyes Publications), pp. 235, 237-240 (1993).

Communication Relating to the Results of the Partial International Search Report from corresponding PCT Application No. PCT/US2006/030395; dated Sep. 19, 2007; 1 page.

* cited by examiner

LASER CLEANING SYSTEM

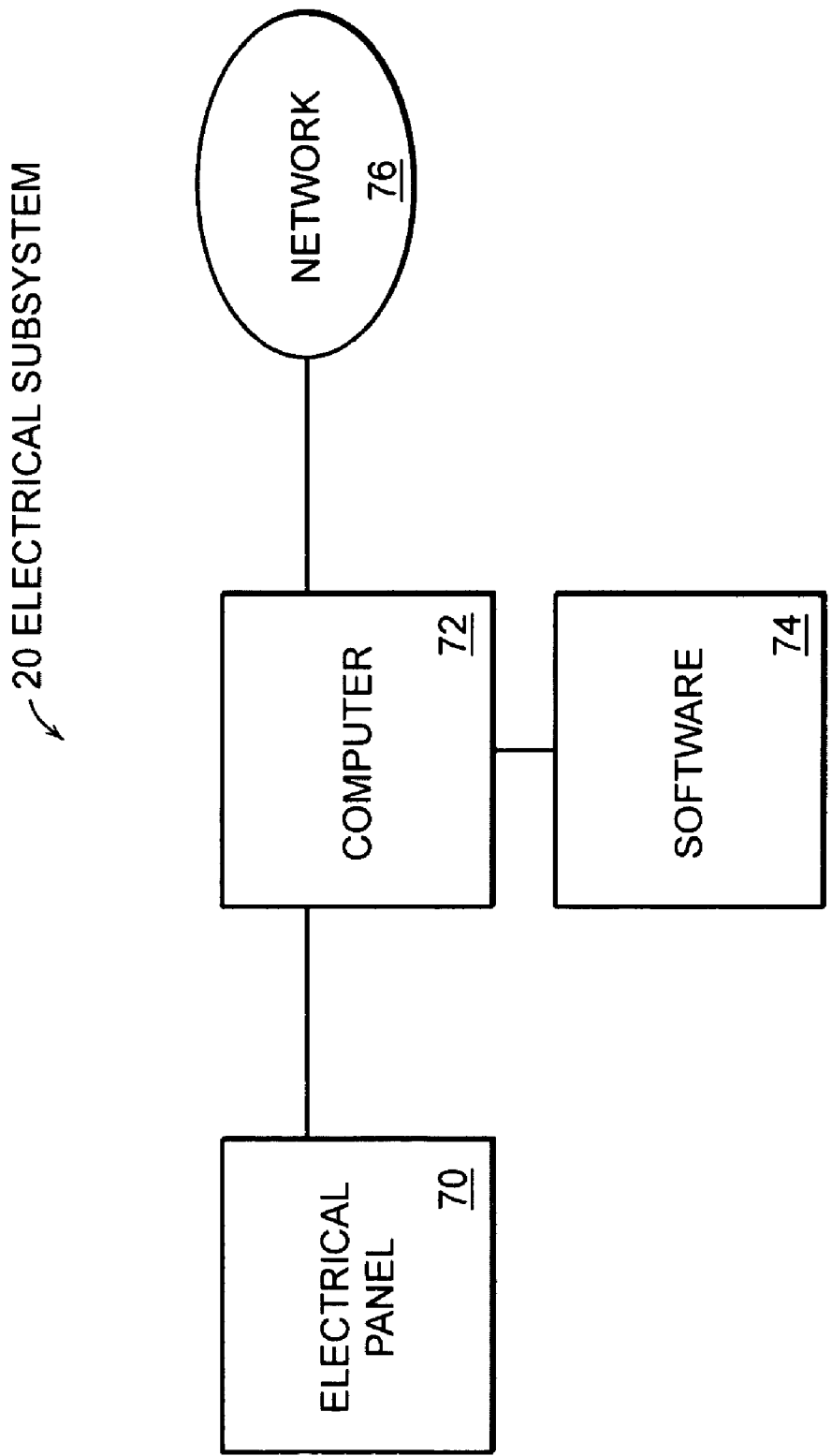

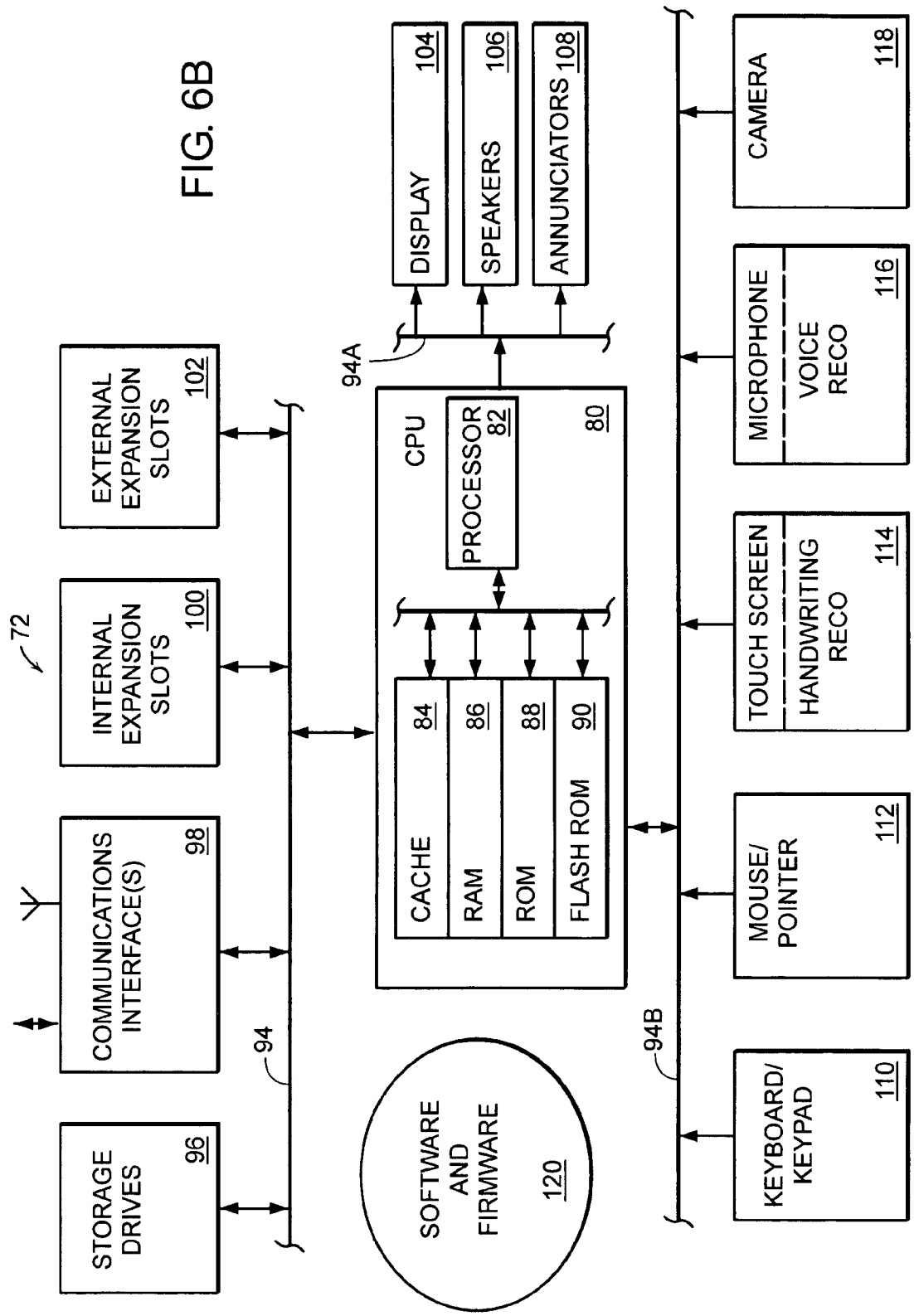

CONTROL
RMS DEVIATION: 2.9 Å

CLEANED
RMS DEVIATION: 2.47 Å

PRIOR ART: CONTROL
RMS DEVIATION: 0.6 Å

PRIOR ART: CLEANED
RMS DEVIATION: 87 Å

METHOD FOR SURFACE CLEANING

CROSS REFERENCES TO RELATED APPLICATIONS

The present application is a divisional application of U.S. patent application Ser. No. 10/870,646, filed Jun. 17, 2004 now abandoned.

The entire content of the above application is incorporated herein by reference in entirety.

BACKGROUND OF THE INVENTION

The manufacture of electronic components and devices involves many processes, or steps, to produce an acceptable final product. Examples of electronic devices and components include, but are not limited to, integrated circuits (ICs), compact disks (CDs), thin film heads (TFHs), and related optoelectronic devices. The processes involved in making these devices and components are for example, but not limited to, annealing, oxidation, recrystallization, ultraviolet (UV) curing, surface conditioning, photo-assisted decomposition and etching, bacteria removal, and electrochemical decomposition. Many of these, especially photolithography, leave behind residues or resist films that must be removed without damaging the device or component being fabricated. Failure to remove these residues may produce results which range from degraded performance of the end product to complete failure.

Surface cleaning during various manufacturing processes is a major component of cost that needs to be minimized. As used herein, surface cleaning broadly includes the removal of films such as photoresist, post-etch residues, and particle removal. Photoresist and organic residue removal is the single largest cleaning application with the most urgent problems in need of solving. Surface cleaning for the removal of photoresist films and organic residues in the IC, CD, TFH, and opto-electronic fields involves the use of many corrosive and toxic wet chemicals, solvents, and large volumes of deionized water. The equipment to deliver these chemicals in the IC industry is complex, expensive, and occupies significant and costly floor space.

Typical cleaning equipment for an IC fabrication facility (IC 'fab') includes plasma ashers, wet benches, and dryers. These contribute to high initial capital costs. Additional facility costs are added, including floor space, plumbing for gases and air control, waste treatment and disposal. Lastly, cost of ownership (CoO) expenses, including spare parts, maintenance, and labor, is added. Wet chemicals, solvents, and deionized water may be used in conjunction with plasma ashers, wet benches, and dryers (generally wet removal techniques) for surface cleaning. The equipment required to deliver, recapture, and process these chemicals is expensive and occupies costly floor space in the manufacturing area. In addition to high equipment and chemical costs, these cleaning techniques often produce unwanted by-products that are considered hazardous and thus may have high disposal costs associated therewith. The most significant cost in wafer cleaning is that related to ultrapure water. This is a primary reason for needing a dry removal method. Wet removal techniques may further damage the delicate and intricate surfaces of the manufactured products because of the corrosive and/or abrasive nature of the cleaning media.

A second typical technique for surface cleaning may be referred to as dry removal techniques. As the name implies, dry removal techniques generally rely on non-liquid agents to perform surface cleaning. One dry removal technique employs an excimer laser operating in conjunction with a gas, such as fluorine. For example, the laser may be used to focus a beam of energy on a silicon wafer having photoresist films thereon. Additionally, a gas, such as fluorine, may be directed to an area around the beam to facilitate a reaction between the optical energy and the photoresists. Many of the dry removal techniques used in the art may fail to sufficiently clean a surface, may take a long time to remove adequate quantities of undesired products such as ion implanted resist or contaminants, may be difficult to operate, may be costly to operate, may damage the surface of the manufactured item, may require wet cleaning to remove carbon-based residues generated by the dry removal technique, may generate hazardous materials or substances and may require gases that are harmful to the environment if not handled and/or processed safely.

What is needed is a dry method or technique for removing unwanted contaminants or resist films from the surface of a substrate and which does not require or generate hazardous gases, liquids, or compounds. Furthermore, the technique should not require sophisticated and expensive handling, control, or cleaning waste product removal/processing apparatus. Further, the method should minimize or avoid damaging the substrate being cleaned to avoid any degradation of performance.

SUMMARY OF THE INVENTION

The preferred embodiments of the present invention relate generally to a system and methods for surface cleaning and more particularly to removal of unwanted films, or contaminants, such as photoresist, post-etch residues and particles using optical energy in the visible or near-visible spectrum in conjunction with a gas to facilitate a state change in these unwanted contaminants such that removal is facilitated, without damage to the surface on which these unwanted contaminants reside.

In accordance with an aspect of the invention, a method for removing residue from the surface of a substrate is provided. The method includes the steps of providing a substrate having residue provided on its surface in a reaction chamber within which a gas mixture is also introduced. The method further includes illuminating a surface of the substrate with radiation from a light source such as a laser having a high repetition rate (1 kHz to 100 kHz). The radiation is selected from the near-visible or visible wavelength of the electromagnetic spectrum. The illumination and introduced gas form a gas reaction zone. The method includes a step of reacting the residue on the surface of the substrate in the gas reaction zone which causes the residue to change state becoming preferentially substantially a gas. The input gas mixture includes, without limitation, oxygen, ozone, and water vapor and is introduced into the chamber to a desired pressure and together with radiation creates a gas reaction zone for a sufficient time to remove contaminants or photoresist without leaving detectible carbon or causing detectible damage.

In a preferred embodiment, the system in accordance with the present invention includes a solid state laser having wavelengths with low photon energies in a near-visible (also called "black light" or "near-UV") portion of the electromagnetic spectrum, as well as visible light, defined as light visible to the human eye. Near-visible is herein defined as wavelengths in the range of 300-400 nm and visible as 380-780 nm. Use of such a laser greatly minimizes damage to the substrate during cleaning. In addition, a gas having low UV absorption properties is employed to facilitate direct oxidization with little or no photoionization. Use of such a gas helps reduce the risk of damaging sensitive substrates such as substrates having a low dielectric constant. Light sources having low powered pulses with pulse energies of less than 1 mJ are employed to facilitate photochemically driven reactions. These types of pulses are also more selective at targeting photoresist and contaminants and have fewer thermal effects as compared to higher powered pulse energies associated with other cleaning techniques.

Embodiments of the invention also employ high laser pulse repetition rates in the range of 1 kHz to 100 kHz to facilitate continual production of reactive species and more complete combustion of the contaminant as well as preventing carbon re-deposition during cleaning.

Preferred embodiments of the present invention include a high concentration of ozone to facilitate more reactive oxidation, higher rate of resist removal and complete carbon removal without requiring the use of water. For example, embodiments of the present invention can employ ozone concentrations in the order of approximately 15% by weight, and carbon removal to the limit of detectability.

In preferred embodiments, water vapor injection is used to enhance production of radical oxygen atoms and hydroxyl (OH) radicals. Water vapor injection also makes the gas reaction zone (GRZ) more effective. Embodiments of the invention can employ water vapor injection rates on the order of 250 sccm. Furthermore, substrates can be cleaned at low temperatures on the order of 90° C. to 110° C. which reduces thermal stresses on the substrate and prevents warpage of the wafer.

In accordance with another aspect of the invention, an apparatus for removing residue from a surface of a substrate is provided. The apparatus includes a holder for holding the substrate while the residue is removed. A chamber surrounding the holder is able to support a range of pressures while the residue is removed. A gas delivery module capable of mixing and delivering a plurality of gases to the chamber is provided. The gas delivery module provides gas or a mixture thereof to the chamber as a gas flow. The apparatus also includes an illumination module for delivering radiation to the surface of the substrate while the substrate is in the chamber and in the presence of the gas flow.

In accordance with still another aspect of the invention, an apparatus for removing residue from the surface of a substrate is provided. The apparatus includes a holder for retaining the substrate using a negative pressure and for heating the substrate to facilitate removal of the residue. The apparatus also includes a substrate delivery module for placing the substrate on the holder and for removing the substrate after residue has been removed. A chamber surrounding the holder is capable of providing a hermetically sealed environment surrounding the surface of the substrate. In addition, the chamber has a window for allowing radiation to pass through while sufficiently illuminating the substrate surface. The apparatus also includes a gas delivery module for delivering a gas flow to the chamber as well as a laser for illuminating the surface of the substrate. The illumination, input gas and residue facilitate a reaction. The reaction is such that it causes the residue to change state from an essentially solid form to primarily a gaseous form. This state change causes the residue to be removed from the surface of the substrate.

In accordance with yet another aspect of the invention, a computer program product is provided. The computer program product includes machine-readable instructions for causing a microprocessor to perform a method for removing organic material from the surface of a substrate in response to executing the machine-readable instructions. The method includes the steps of placing the substrate into a holder located within a chamber, and forming a gas reaction zone in the chamber by illuminating the surface of the substrate using radiation from a laser and flowing a gas mixture into the chamber. The radiation from the laser causes the organic material to react with the gas thereby removing the organic material from the substrate.

The foregoing and other features and advantages of the system and methods for surface cleaning will be apparent from the following more particular description of preferred embodiments of the system and method as illustrated in the accompanying drawings. The drawings are not necessarily to scale with emphasis instead being placed upon illustrating the principles of the invention. The principles and features of this invention may be employed in various and numerous enhancements without departing from the scope of the invention.

BRIEF DESCRIPTION OF THE DRAWINGS

FIG. 6A illustrates a schematic representation of an electrical subsystem in accordance with aspects of a preferred embodiment of the invention;

FIGS. 6B and 6C illustrate schematic representations of a general purpose computer and software, respectively, in accordance with aspects of the invention;

DETAILED DESCRIPTION OF THE INVENTION

A preferred embodiment of the present invention consists of an automated, low cost, all-dry cleaning system that employs small volumes of oxygen, ozone and water vapor to remove photoresist and other organic residues, or matter, in a single step using a small laser emitting primarily 355 nm near-visible and residual 532 nm visible radiation wavelengths. By using embodiments of the invention, the surfaces of substrates are cleaned without leaving detectible roughening or detectible carbon residues. Substrate as used herein refers to any essentially planar surface having unwanted materials or substances disposed thereon. An example of a substrate is, but not limited to, a silicon wafer. For example, in one post cleaning test and analysis, the average carbon remaining from multiple readings was 3.27 Å. Use of a preferred embodiment of the invention also facilitates environmentally sound operations because no hazardous by-products requiring special handling or treatment are generated. Furthermore, high system throughput is achievable using embodiments of the invention that can approach 20 wafers per hour using a single system operated by a single operator.

Figure 1A:
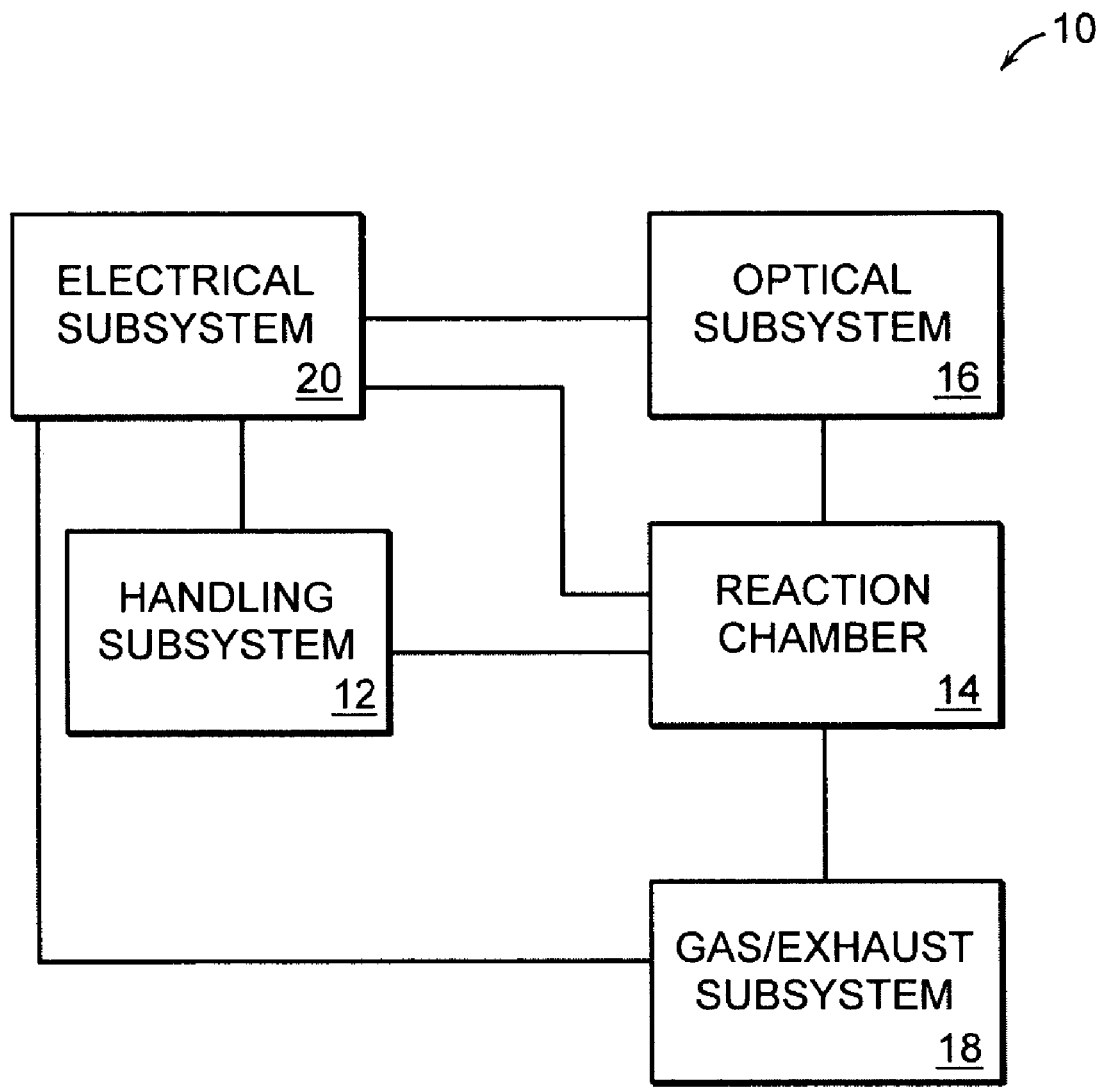
FIGS. 1A and 1B are schematic representations of a system for dry cleaning semiconductor substrates in accordance with aspects of a preferred embodiment of the invention.

FIG. 1A illustrates a schematic representation of a cleaning system employing near-visible radiation and one or more gases. Cleaning system 10 may include a handling system 12 for manipulating a silicon wafer or other substrate or device to be cleaned, a reaction chamber 14 for providing a controlled environment to the wafer while undergoing cleaning, an optical subsystem 16 for providing optical radiation to the wafer to facilitate cleaning, a gas/exhaust subsystem 18 for providing gases necessary to facilitate cleaning and for evacuating gaseous by-products and unconsumed supplied gases after cleaning is completed, and an electrical subsystem 20 for supplying power to electrical and electromechanical components operating within system 10.

Figure 1B:
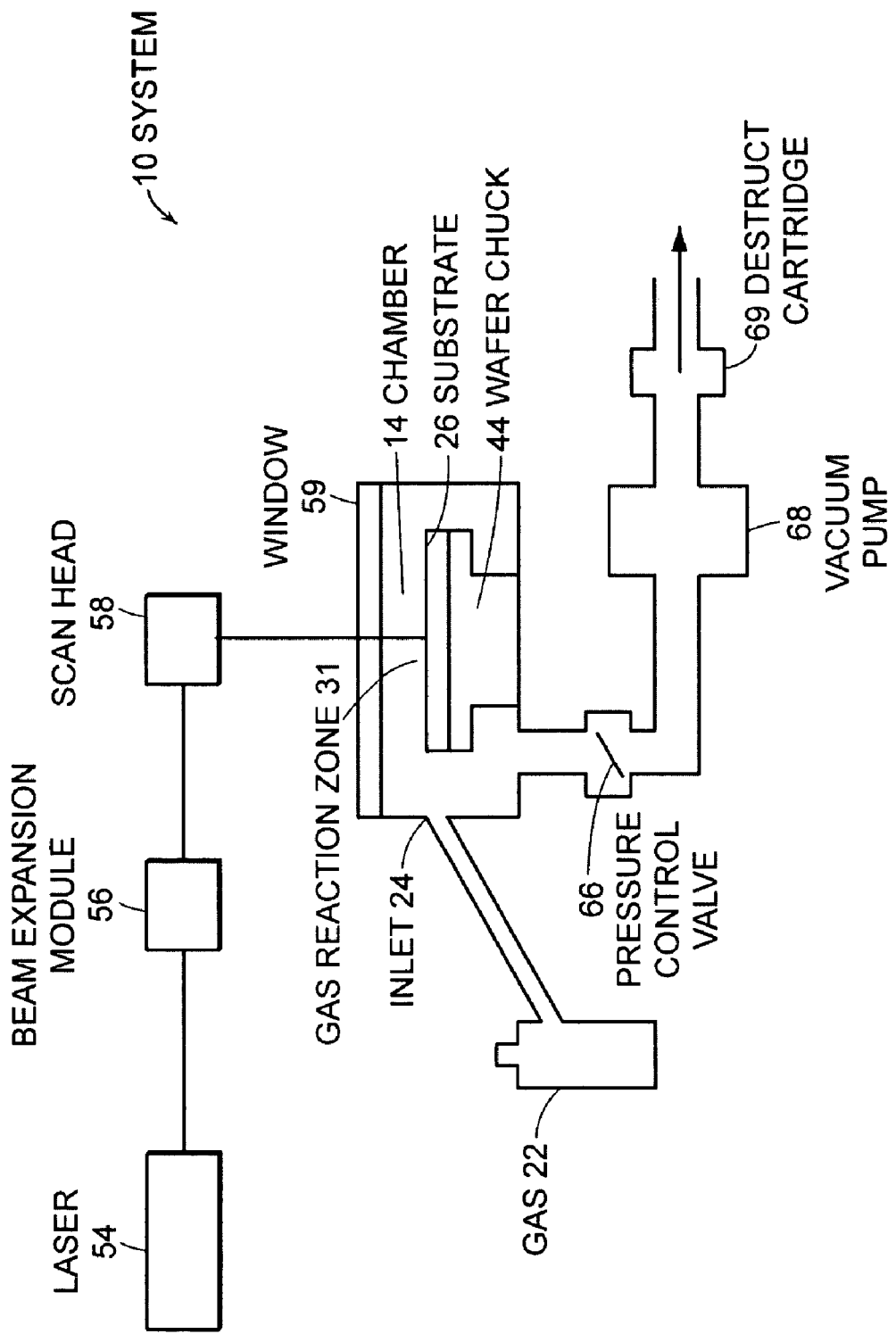

FIG. 1B illustrates an alternative schematic representation that is useful for understanding the basic operation of system 10. The components of FIGS. 1A and 1B are exemplary and will be described in further detail in conjunction with the respective subsystems to which they belong. In general, laser 54 passes optical radiation through optics and mirrors, such as beam expansion module 56 and scan head 58, before irradiating substrate 26 through window 59 of reaction chamber 14. The substrate 26 is retained in the reaction chamber using a chuck 44. Reaction chamber 14 provides a low volume enclosed area for facilitating creation of a local environment favorable to employing the dry cleaning methods described herein. As used herein, local environment refer to conditions within the reaction chamber. A favorable local environment is created and maintained in large part by formation of a gas reaction zone 31 within reaction chamber 14. Gas reaction zone 31 facilitates combustion of organic material disposed on the surface of the substrate being cleaned. The combination of organic matter causes a state change from solid or semi-solid form to a gaseous form. A gas 22 such as oxygen is delivered from a receptacle such as a tank and valve combination through an inlet 24 communicatively associated with reaction chamber 14.

A substrate 26, or other work piece, is maintained in a predetermined position using a centering ring which in an embodiment is integral with the chuck. Pressure valve 66 and pump 68 are used to exhaust excess gas 22 and combustion waste materials resulting from the cleaning operation. A destruct cartridge 69 may be employed to ensure that undesirable waste products and gases are destroyed or converted to a desired substance before being discharged into the facility exhaust system.

Figure 2:
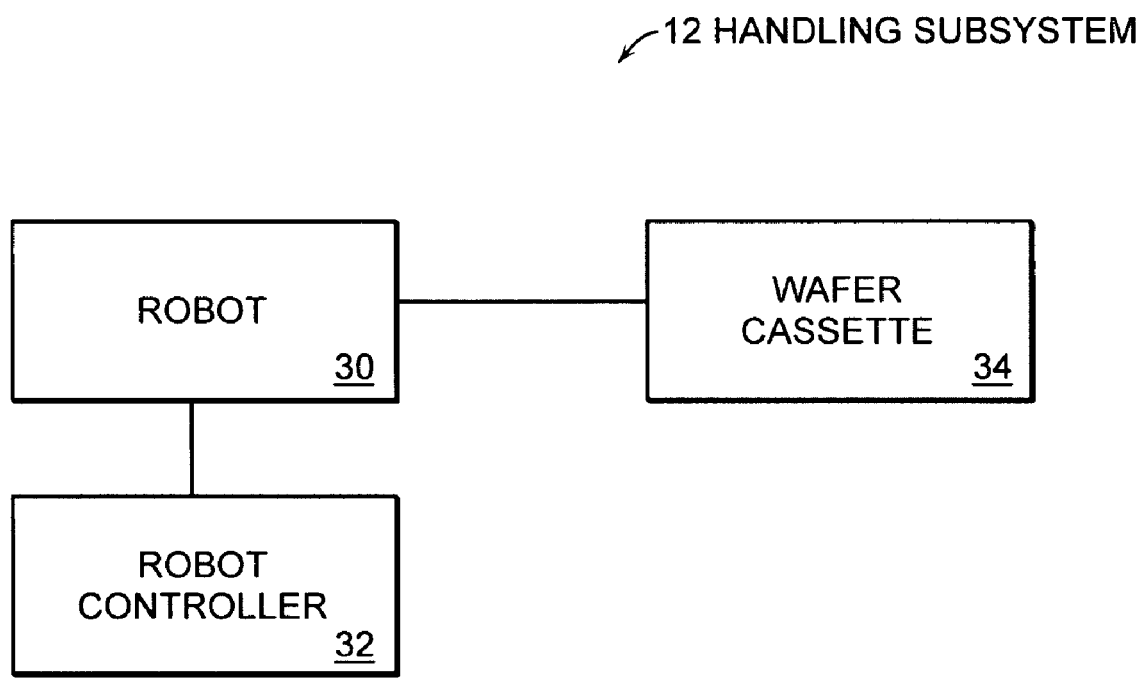
FIG. 2 illustrates a schematic representation of a handling subsystem in accordance with aspects of a preferred embodiment of the invention.

FIG. 2 illustrates a schematic representation of a handling subsystem 12 in accordance with aspects and embodiments of the invention. Handling subsystem 12 may include among other things a robot 30, robot controller 32 and wafer cassette 34. A plurality of wafers, or substrates 26, are temporarily and removably loaded into a cassette which acts as a holder and allows for queuing of the wafers 26 prior to and after cleaning. Wafer cassette 34 may be capable of holding any number of wafers 26 depending on system sizing requirements and other desired operating parameters. The loaded wafer cassette 34 is placed into a cabinet or other receptacle in system 10. Robot 30 scans wafer cassette 34 to identify the number, position and possibly type, of wafers 26 to be cleaned. Robot 30 may feed this information to a robot controller 32 or another device for use in determining if sufficient gas 22, and power, for example, are available to clean all queued wafers 26.

Robot 30 may operate by way of machine-executable instructions loaded from, for example, a computer-readable memory or program product, from robot controller 32, or robot 30 may receive instructions by way of an input device such as a keypad. The machine-executable instructions for controlling the operation of a cleaning session including loading and unloading of the wafers 26 are generally referred to herein as a recipe. The robot 30 operates in response to the recipe to remove one of the wafers 26 from the cassette 34. Robot 30 may use mechanical, adhesive, friction, suction, or other devices for retaining a wafer 26 for loading and unloading. In a preferred embodiment, robot 30 uses a vacuum for retaining a wafer 26 while removing it from the cassette and placing it on the wafer chuck 44, and in an alternative embodiment robot 30 uses a hingedly closeable jaw to retain wafer 26. Robot controller 32 controls and coordinates the actions of robot 30 as well as monitors error codes associated with operation of robot 30. Handling subsystem 12 may also employ switches, for example, optical sensors, motion sensors, magnetic switches, and inductive sensors for sensing the location, operation, and operating parameters associated with robot 30.

Figure 3A:
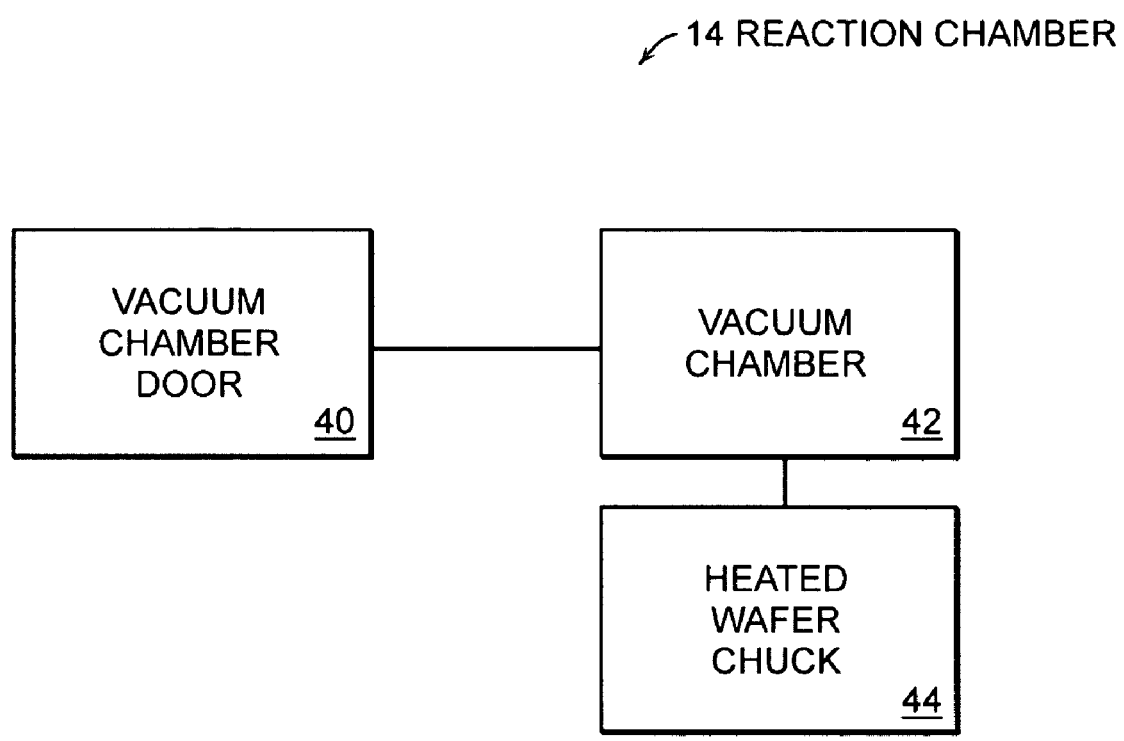
FIG. 3A illustrates a schematic representation of a reaction chamber in accordance with aspects of a preferred embodiment of the invention.

FIG. 3A illustrates a schematic representation of reaction chamber 14 consistent with aspects and embodiments of the invention. Reaction chamber 14 may include among other things a vacuum chamber door 40, a vacuum chamber 42 and a heated wafer chuck 44. Vacuum chamber door 40 opens to receive a wafer 26 from robot 30. Control of vacuum chamber door 40 may be coordinated by robot controller 32 or another controller associated with system 10. Vacuum chamber 42 may employ sensors that detect pressure and/or gas concentrations to ensure that vacuum chamber door 40 opens only when pressure inside the vacuum chamber 42 is equal to pressure outside of the chamber or when concentrations of gas injected into vacuum chamber 42 fall below a defined threshold. During operation, vacuum chamber 42 may support a positive pressure or a negative pressure with respect to atmospheric pressure proximate to system 10. Robot 30 inserts a wafer 26 into vacuum chamber 42 by way of a retractably manipulated arm and positions wafer 26 on heated wafer chuck 44. After depositing the wafer 26 onto chuck 44, the arm retracts and is retained in a stowed position until needed for removal of a cleaned wafer 26. Heated wafer chuck 44 retains and heats wafer 26 while undergoing cleaning. Heat can be applied by way of electro-resistive elements, such as NiChrome wires, by way of heated gas, or by way of other heating elements known in the art. Employing a heated wafer 26 during the cleaning process facilitates gas/radiation interaction with the organic residues being removed from the wafer surface. Embodiments of the preferred invention heat wafer 26 to temperatures of 90-110° C., and in a preferred embodiment of the invention wafer 26 is heated to a temperature of approximately 100° C.; however, other wafer temperatures may be employed if desired. Wafer 26 is retained in chuck 44 using a centering ring, and chuck 44 may be moveable or it may be of a fixed design. If chuck 44 is moveable, then scan head 58 may remain stationary. For example, chuck 44 containing wafer 26 can be moved in a defined pattern so as to facilitate having radiation, such as optical radiation, contact the entire surface of wafer 26 during a complete cleaning cycle. In contrast, in this embodiment, if chuck 44 is fixed, scan head 58 moves the beam causing optical radiation to contact the entire surface of wafer 26.

Figure 3B:
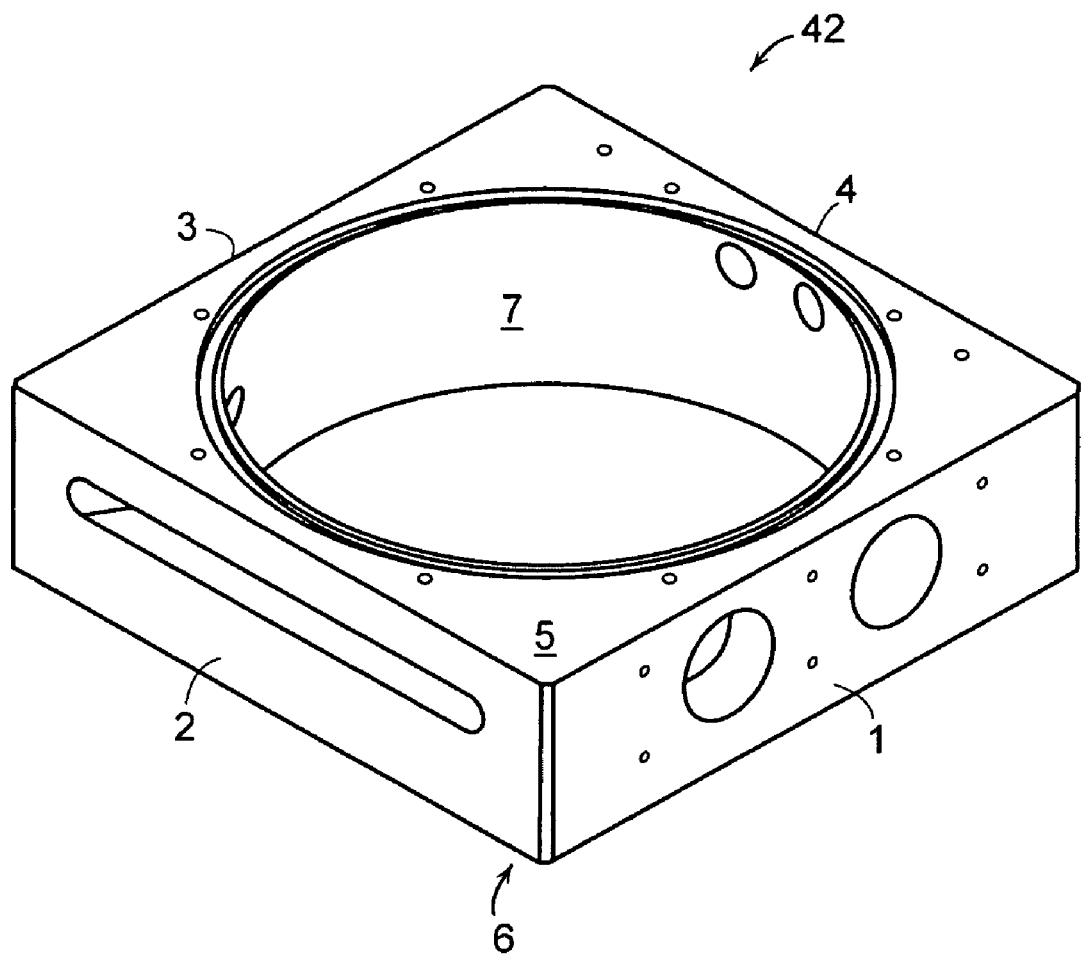
FIG. 3B illustrates a perspective view of an exemplary reaction chamber in accordance with aspects of a preferred embodiment of the invention.

FIG. 3B illustrates a perspective view of an embodiment of vacuum chamber 42 having a first side 1, a second side 2, a third side 3, a fourth side 4, an upper surface 5, a lower surface 6 and an inner wall 7. First side 1 is opposedly mounted from second side 2 while third side 3 is opposedly mounted from fourth side 4. The sides are joined to form a square or rectangular shape having a top surface 5 contacting an upper edge of the sides 1, 2, 3 and 4 and a lower surface contacting a lower edge of the sides 1, 2, 3, and 4. Vacuum chamber 42 also has an inner wall 7 which can be circular in shape and forms an inner cavity into which a wafer 26 and chuck 44 can be located. Vacuum chamber 42 may also include an upper cover having a window 18 for sealing the chamber and allowing optical radiation into chamber 42 for illuminating the surface of wafer 26. Employing a vacuum chamber 42 makes it possible to provide a small sealable environment into which gas can be inserted, or injected, for facilitating formation of a GRZ when cleaning wafer 26. Vacuum chamber 42 can take many other shapes and can be made from any of a plurality of materials such as stainless steel, aluminum, glass, composite, plastic, and the like without departing from the spirit of the invention.

Figure 4:
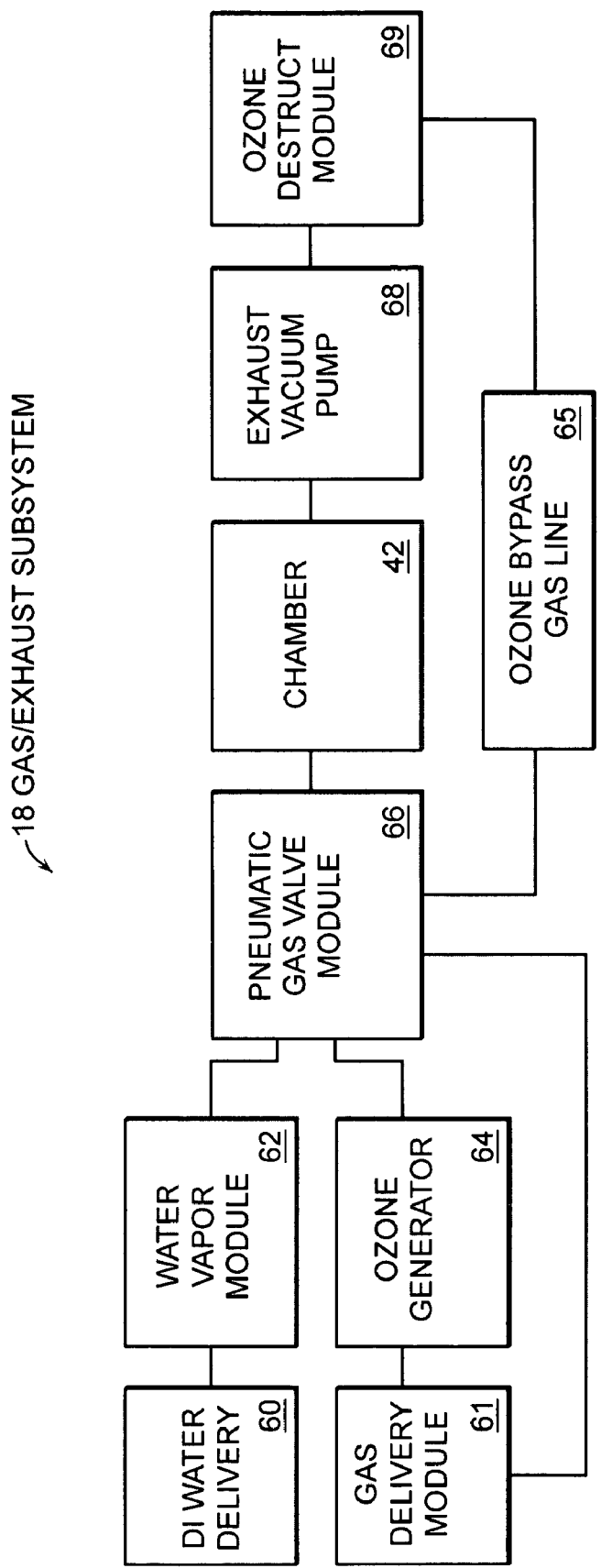
FIG. 4 illustrates a schematic representation of a gas/exhaust subsystem in accordance with aspects of a preferred embodiment of the invention.

FIG. 4 illustrates a schematic representation of a gas delivery and gas exhaust subsystem 18, collectively gas subsystem 18, that is useful for facilitating fast and efficient cleaning when practicing preferred embodiments of the invention. Gas subsystem 18 may include a gas delivery module 61, a deionized water (DI) delivery module 60, a chamber 42, a water vapor module 62, an ozone generator 64, an ozone bypass gas line 65, a pneumatic gas valve module 66, an exhaust/vacuum pump 68 and an ozone destruction module 69.

Gas delivery module 60 may include a gas cylinder, gas generator, or other device suitable for generating or storing a desired gas for delivery to vacuum chamber 42. Water vapor module 62 provides airborne moisture for reaction chamber 14 using methods and apparatus known in the relevant arts. Use of vapor module 62 helps facilitate a reaction between a gas delivered from gas delivery module 60 and the optical radiation delivered from the optical subsystem 16 when in contact with organic material on the surface of wafer 26. An ozone generator 64 may also be utilized in conjunction with gas delivery module 60 and water vapor module 62. Ozone generator 64 produces ozone gas in accordance with methods known and used in the relevant arts. A pneumatic control module 66 may be employed to regulate and deliver gas, water vapor and ozone in defined mixtures. Pneumatic gas valve module 66 typically consists of an actuated valve assembly having a plurality of input ports and a single output port; however, pneumatic control module 66 can take other forms and may be implemented as a collection of discrete components rather than as a single assembly. For example, a recipe entered into system 10 by an operator may call for a specific ratio of gas/water vapor/ozone to facilitate a desired cleaning action and may further specify a desired internal pressure for vacuum chamber 42 during a cleaning cycle.

The output of pneumatic control module 66 may be directed to a spot, or area, proximate to the illuminated surface of wafer 26. Small diameter piping or other means may be used to direct the gas/water vapor/ozone mixture with precision. Directing the gas/water vapor/ozone mixture to a specific area on wafer 26 forms a gas reaction zone (GRZ) in the volume surrounding the illuminating beam of the laser on the surface of wafer 26. Use of a localized GRZ facilitates rapid and efficient cleaning of wafer 26 since the reactive species are confined to those areas being cleaned and not the entire chamber. In a preferred embodiment gas is fed to chamber 14 at a rate of approximately 4-9 slm. The reaction chamber 14 may operate at a positive pressure with respect to the ambient environment surrounding system 10 or reaction chamber 14 may operate at a negative pressure with respect to the ambient environment surrounding system 10.

In a preferred embodiment, cleaning takes place with the reaction chamber 14 having a pressure of 50 Torr; however alternative embodiments have been operated at pressures between 40 Torr and 760 Torr. In addition, cleaning may occur in the reaction chamber 42 at positive pressures ranging up to approximately 5,000 pounds per square inch (psi). Exhaust/vacuum pump 68 also exhausts excess gas and airborne cleaning by-products from reaction chamber 14. Exhausted gas and combustion by-products may be passed through an ozone destruction module 69 and/or filtering modules. Alternatively, ozone bypass gas line 65 may be used to send ozone gas from valve module 66 directly to ozone destruct module 69. The output of ozone destruction module 69 as well as outputs from filtering modules may be sent to the facility exhaust system.

Figure 5A:
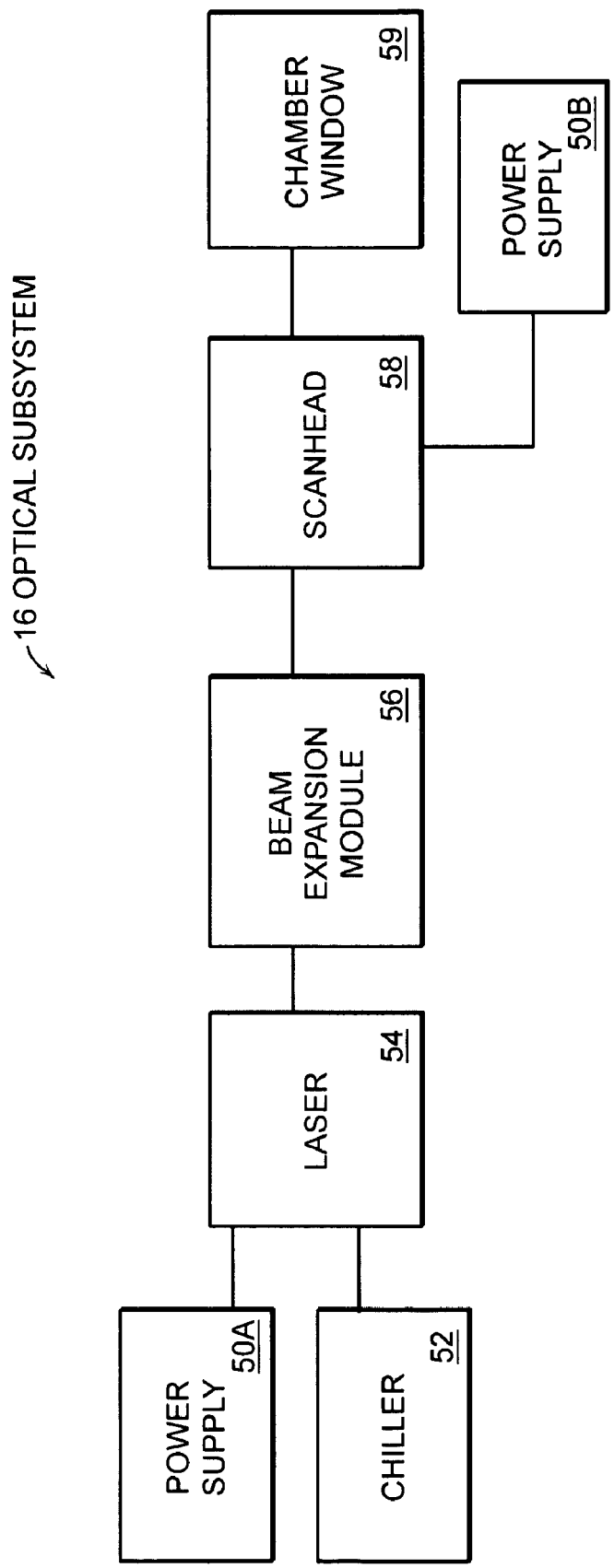
FIG. 5A illustrates a schematic representation of an optical subsystem in accordance with aspects of a preferred embodiment of the invention.

FIG. 5A illustrates optical subsystem 16 which may include power supplies 50A, 50B, a chiller 52, a laser 54, a beam steering module 56, a scan head 58 and a chamber window 59. Power supply 50A converts electrical energy received from a source such as a wall outlet into a voltage and current acceptable for operating the laser subsystem 54, and power supply 50B supplies power to scanhead 58. Power supplies 50A, 50B may be comprised of multi-tap transformers for delivering a plurality of voltages, switched regulators, and the like. Chiller 52 provides cooling to laser 54. Chiller 52 typically consists of a water refrigeration unit combined with a circulation pump for passing chilled water through flexible piping to laser 54 where heat is passed from the laser to the water. The water then returns to the refrigeration unit where heat is removed from the water and circulated back to the laser 54. Chiller 52 may also include temperature, pressure, water flow, and other sensors to monitor performance thereof.

Laser 54 serves as the source for optical radiation used to clean wafer 26. In a preferred embodiment, a 10-Watt solid state laser emitting radiation wavelengths with photon energies in the vicinity of 2.33 eV to 3.49 eV is employed. This laser maintains a low population of damaging ions which reduces damage to wafer 26 and helps maintain high integrated circuit yields post cleaning. The preferred embodiment of laser 54 reduces damage caused by the high thermal environments and radiation energy fields that can be caused by prior art techniques operating in the vicinity of 5.0 eV to 7.21 eV. The preferred embodiment of laser 54 employs a primary output wavelength of substantially 355 nanometers (nm) and a residual wavelength of substantially 532 nm. The laser 54 is further operated to provide an output pulse energy of less than 1 milli-Joule (mJ) and employs a repetition rate of between 1 kHz and 100 kHz.

Figure 5B:
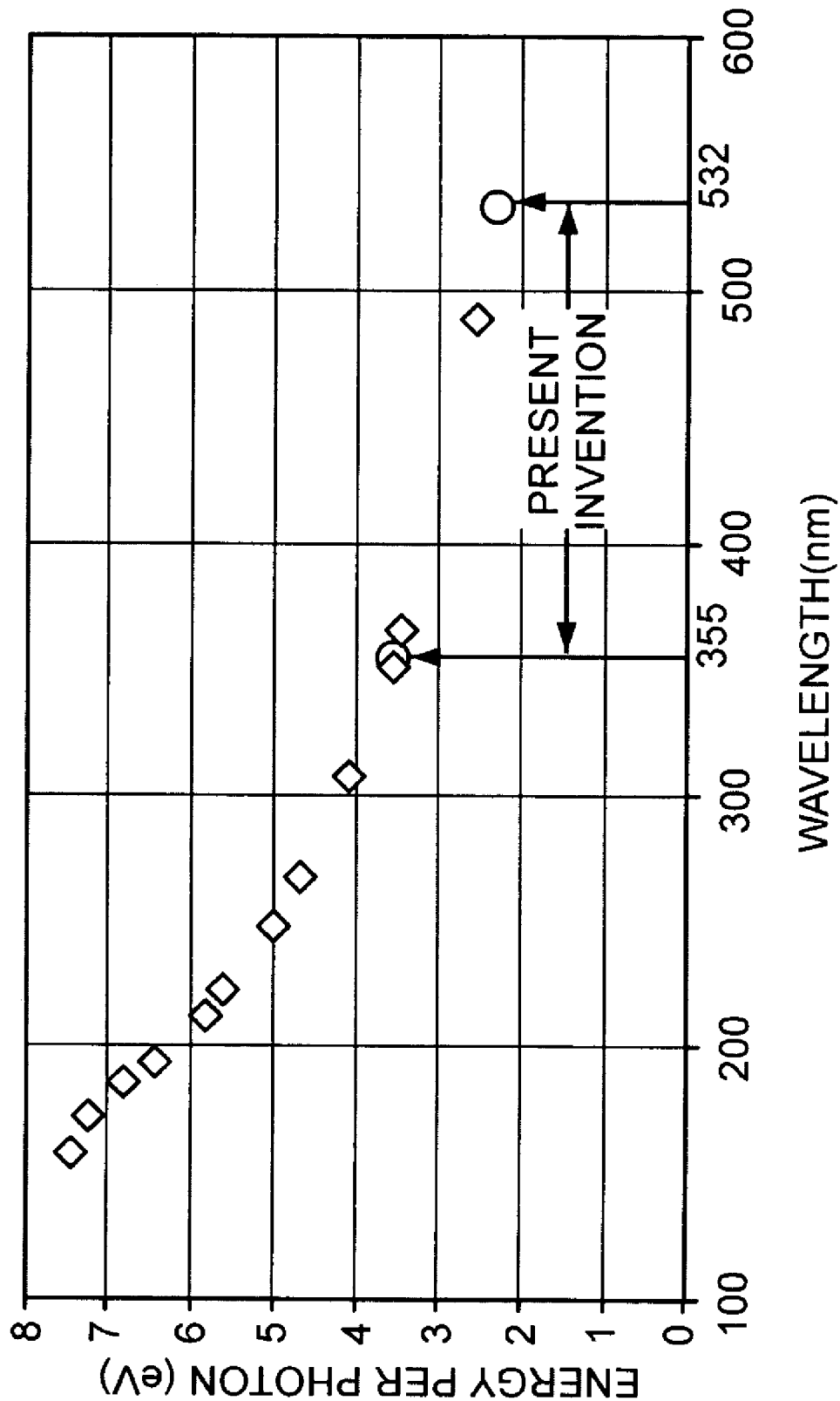
FIG. 5B is a graph showing photon energy levels as a function of wavelength for a plurality of laser types in accordance with a preferred embodiment of the present invention.

FIG. 5B illustrates a plot showing the energy per photon for a plurality of laser output wavelengths. From the figure it can be seen that embodiments of the invention employing 355 and 532 nm output wavelengths have much lower energy per photon values than shorter UV wavelengths commonly employed in prior art techniques. Use of lower energy per photon levels reduces the possibility of damaging wafer 26 when using optical energy to facilitate cleaning.

TABLE 1

| Wavelength (nm) | Source | eV/Photon |
|---|---|---|
| 157 | $F_2$ Laser | 7.43 |
| 172 | Xe Excimer Lamp | 7.21 |
| 185 | Hg Lamp | 6.76 |
| 193 | A + F Excimer Laser | 6.42 |
| 213 | 5× Yag | 5.78 |
| 222 | KrCl Excimer Lamp | 5.58 |
| 248 | KrF Excimer Laser | 5.00 |
| 266 | 4× Yag | 4.66 |
| 308 | XeCl Excimer Laser | 4.03 |
| 351 | $XeF_2$ Excimer Laser | 3.53 |
| 355 | 3× Yag | 3.49 |
| 365 | i-Line Lamp | 3.41 |
| 488 | Doped Lamp | 2.53 |
| 532 | 2× Yag | 2.33 |

Figure 5C:
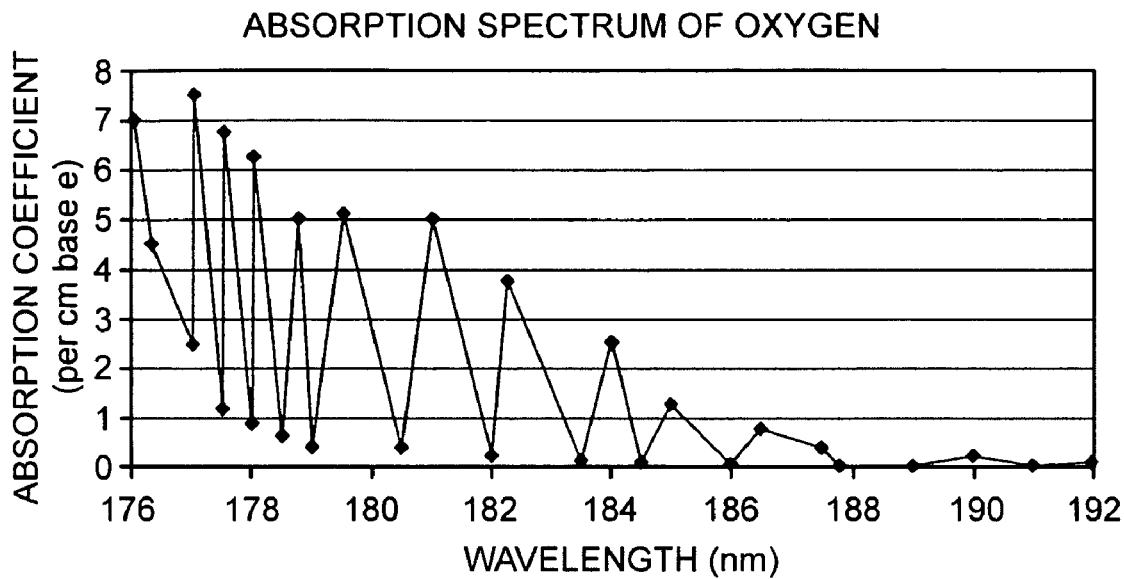
FIGS. 5C-5G illustrate the absorption spectrum of oxygen, ozone and water as well as the gain profile for an KrF excimer laser and absorption coefficients as a function of wavelength for types of resists, respectively, in accordance with a preferred embodiment of the present invention.
Figure 5D:
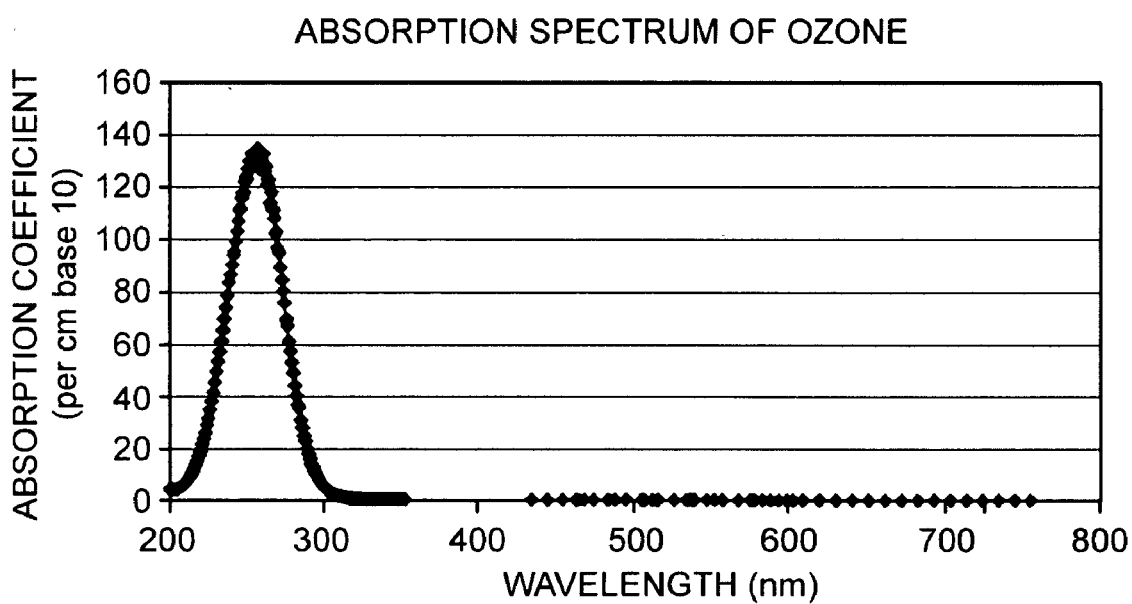
Figure 5E:
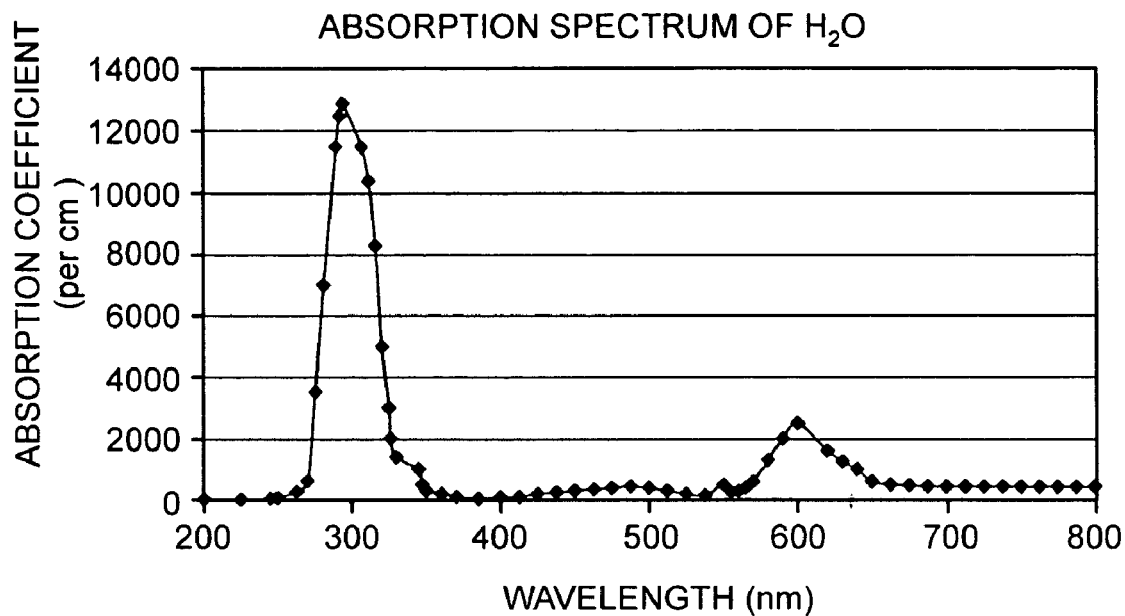
Figure 5F:
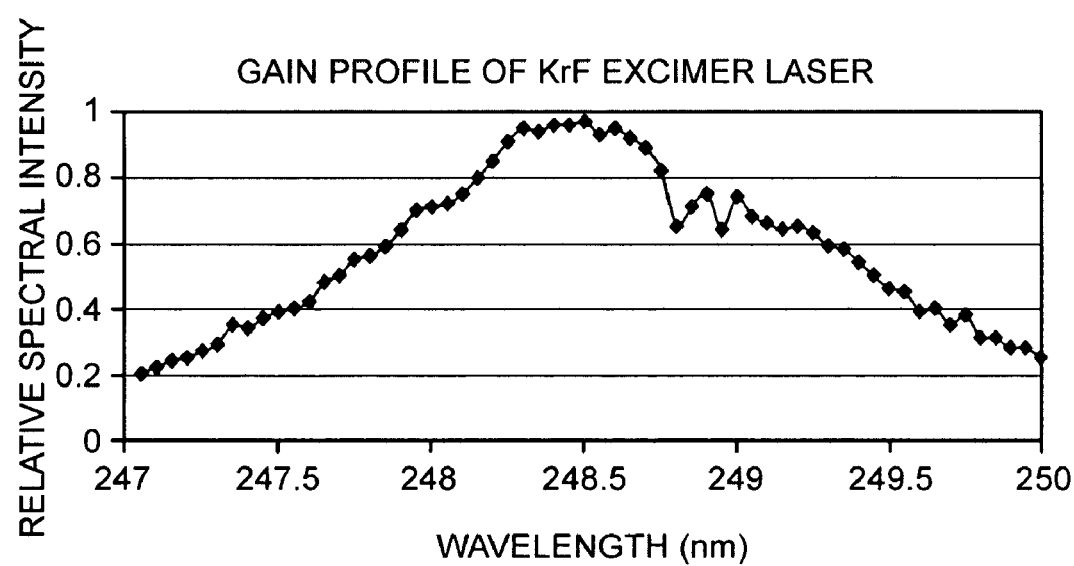

FIGS. 5C-5E graphically illustrate the absorption spectra for oxygen, ozone and water as a function of optical wavelength. As can be seen from the figures, absorption rates increase for oxygen, ozone and water as wavelength decreases, i.e. approaches the ultraviolet (UV) spectrum. By operating preferred embodiments of the invention in the ranges of 355 nm and 532 nm, substantially less optical energy is absorbed than if cleaning were performed at wavelengths on the order of 193 nm as taught by some prior art references. FIG. 5F illustrates a graph of a gain profile showing the relative spectral intensity as a function of wavelength for a KrF excimer laser which can be used when practicing embodiments of the invention.

Figure 5G:
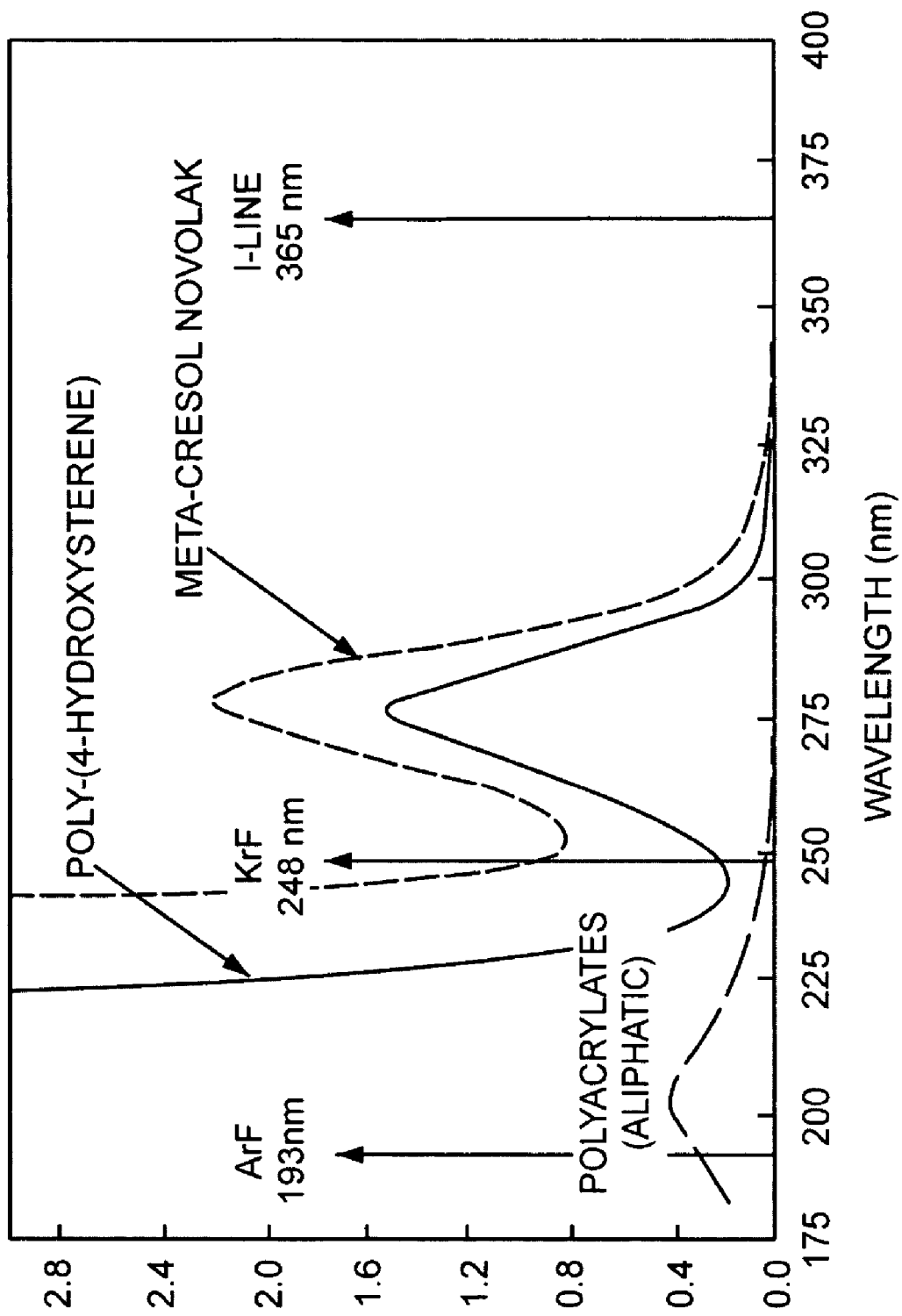

FIG. 5G shows the spectral absorbance of typical photoresists used in IC manufacturing. The near-visible and visible illuminations of embodiments of the present invention are highly absorbed by photoresists, contributing to high removal efficiency. UV wavelengths of the prior art are highly absorbed mainly on the surface of the resist, requiring longer exposure times to remove.

Figure 5H:
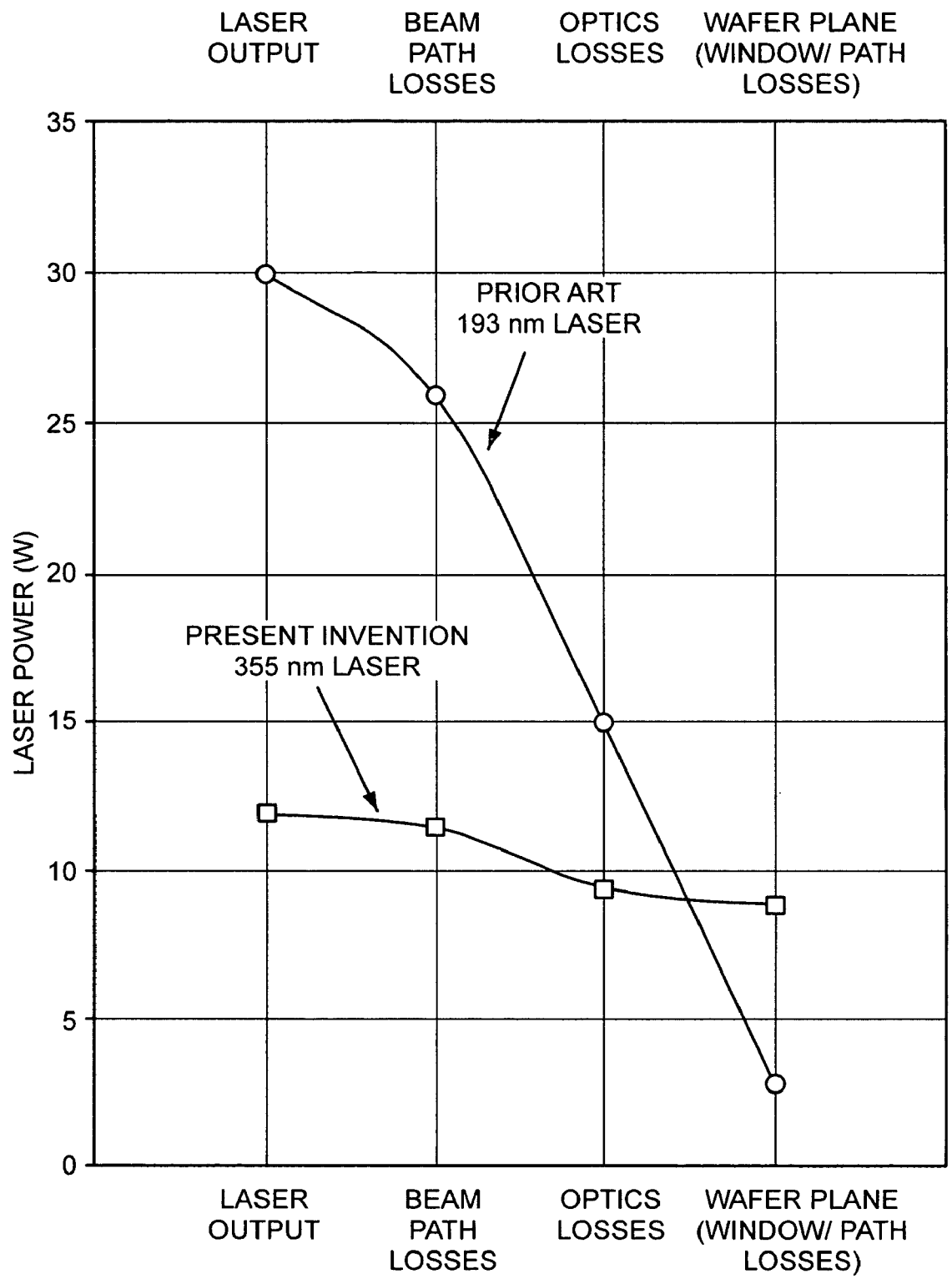
FIG. 5H graphically illustrates laser power for a 193 nm laser and a 355 nm laser as well as showing exemplary optical losses for the respective beams associated with various optical paths and other loss metrics in accordance with a preferred embodiment of the present invention.

FIG. 5H illustrates exemplary curves showing the losses of laser output power associated with passing the beam through typical optical components used to facilitate cleaning of photoresist using optical energy. The graph shows the output powers for a 193 nm and 355 nm laser as well as beam path losses, optic losses and energies at the wafer plane. As seen from FIG. 5H embodiments of the invention employing a 355 nm source can deliver less output power while still delivering more power to the wafer surface. The results shown in FIG. 5H are explained by the fact that a 355 nm beam is less lossy when passing through optical components and gases used to facilitate cleaning as compared to a beam operating in the vicinity of 193 nm.

Embodiments of the present invention may be used to remove a variety of photoresists used at various UV wavelengths including but not limited to deep UV resists at 157 nm, 193 nm, and 248 nm, as well as I-line (365 nm) and g-line (436 nm) resists. Resin chemistries can vary in the aforementioned resists and may include novolaks for the longer wavelength resists, and polyvinylphenols, acrylates, acetals, polyimides and ketals for the shorter wavelength resists. In addition, employing a GRZ 31 consistent with embodiments of the invention provides for a localized area having a very strong oxidizing nature thus making the present invention useful over a wide range of resist types. In addition, embodiments of the invention can be used on hard-baked photoresist alone or which has been processed, such as through ion implantation or semiconductor etch processes.

The use of longer wavelengths also allows higher concentrations of gases such as ozone to be used since the 355 nm and 532 nm wavelengths are not absorbed by the gases to the degree that short (180 to 300 nm) UV wavelengths are absorbed. By way of example, ozone levels on the order of 0.5% to 4% can be used with many prior art UV wavelength cleaning techniques. When ozone levels increase above 4% in these systems, the amount of optical power reaching the substrate is reduced to a level impacting efficient operation of the system. In contrast, embodiments of the invention can operate with ozone levels in the range of 10-20% by weight and in a preferred embodiment, 15% by weight. Use of higher concentrations of oxidizing gases such as ozone facilitated fast, efficient and safe cleaning of wafer 26 without damage.

Embodiments of the invention may be operated with a primary 355 nm beam while retaining residual radiation in the 532 nm region within the same beam, operated with a primary 355 nm beam while filtering out the residual radiation at 532 nm, operated with a primary 532 nm beam, or operated with a 355 nm beam and a separate 532 nm beam. In addition, other embodiments of the invention may employ other wavelengths ranging from 300 nm to 600 nm alone or in any combination. The choice of wavelength may be a function of optimizing gas absorption parameters associated with a desired GRZ size and composition, cleaning time, available laser output wavelengths, type or resist being removed, type of wafer being cleaned, type of contaminant being targeted, and the like.

Beam steering module 56 is used to steer the output beam of laser 54 in a desired direction and to assist in focusing the beam on a desired plane. Beam expansion module 56 may consist of prisms, mirrors, lenses, and the like. Beam expansion module 56 may be controlled electronically or mechanically. If controlled electronically, control may be by way of a controller executing machine-readable instructions and operating in conjunction with motors, extendable arms, servos, gyros, electromagnetic positioning means, and the like. Scan head 58 is used to move the optic beam across the surface of wafer 26. Scan head 58 is operated in conjunction with gas/exhaust subsystem 18 to ensure that the GRZ 31 is always proximate to the area of wafer 26 being illuminated by laser 54. The output of scan head 58 is directed through chamber window 59 and onto the surface of wafer 26 inside the reaction chamber 14.

In a preferred embodiment, the beam from laser 54 is shaped by beam expansion module 56 and scan head 58, such that an intentionally defocused beam impacts the wafer plane, or surface of wafer 26 in order to reduce the effects of radiation damage. However, in an alternative embodiment, the laser beam is focused at the wafer plane and is not shaped by optics. By way of example, in an embodiment of the invention the beam is de-focused by 50 mm or 2 inches. In this embodiment, the focal plane of the laser light is 2 inches away from the surface of wafer 26. The use of de-focused beams contrasts with techniques used in the prior art which employ, among other things, using blades of light that were created by optically forming long, thin rectangular blades, and focusing these blades of light at the wafer plane. These focused blades of short wavelength UV light had the potential to cause non-uniformity in the resist and leave patterns on the substrate being cleaned. In addition, focused blades of UV radiation have been known to cause greater surface roughening than the longer near-visible (also referred to as 'far ultraviolet' or 'black light') wavelengths of 350 nm-380 nm and 532 nm visible wavelengths. The use of the near-visible 355 nm and visible 532 nm wavelengths in conjunction with embodiments of the invention also eliminates the need for nitrogen purging in the optics enclosures.

At short UV wavelengths, oxygen is broken down to produce ozone, and because ozone is strongly absorbent at 193 nm, the beam line must be nitrogen purged to prevent severe losses of UV energy. As previously noted, the use of short UV wavelengths, such as those discussed in the prior art, are strongly absorbed by ozone thus typically limiting the useful ozone concentration to <4% by weight. This ozone absorption also requires the use of shallow 0.5 mm gaps between the wafer and the chamber window in ozone ashers. In contrast, embodiments of the invention using wavelengths on the order of 355 nm and 532 nm allow use of a gap width (reaction chamber window 59 to surface of wafer 26) of greater than 20 mm. And in addition, embodiments of the invention allow for the use of very high (10% to 20% by weight) concentrations (pl) of ozone to strip photoresist without leaving a carbon residue. The longer wavelengths in preferred embodiments of the present invention substantially reduce and preferably eliminate .the ozone absorption, light scattering and high photon energy problems associated with short wavelength methods.

Embodiments of the invention make use of the raw laser beam, thus eliminating the need for a customized, costly, energy absorbing, beam-shaping optical system. This raw beam is deflected with mirrors in beam steering module 56 and/or scan head 58 to illuminate the wafer surface in one of several optimized scanning patterns. Making use of the natural output of the laser provides for the most energy efficient method of cleaning wafer 26. For example, the embodiments of the present invention may use approximately a 12 watt solid state laser in place of a 30 watt excimer laser for removing a layer of photoresist. The 12 watt solid state laser delivers about 9 watts at the wafer plane, whereas the excimer laser delivers 4 watts. Furthermore, keeping the light out of focus allows the rays to homogenize and produce increased uniformity at the wafer plane.

Figure 6C:
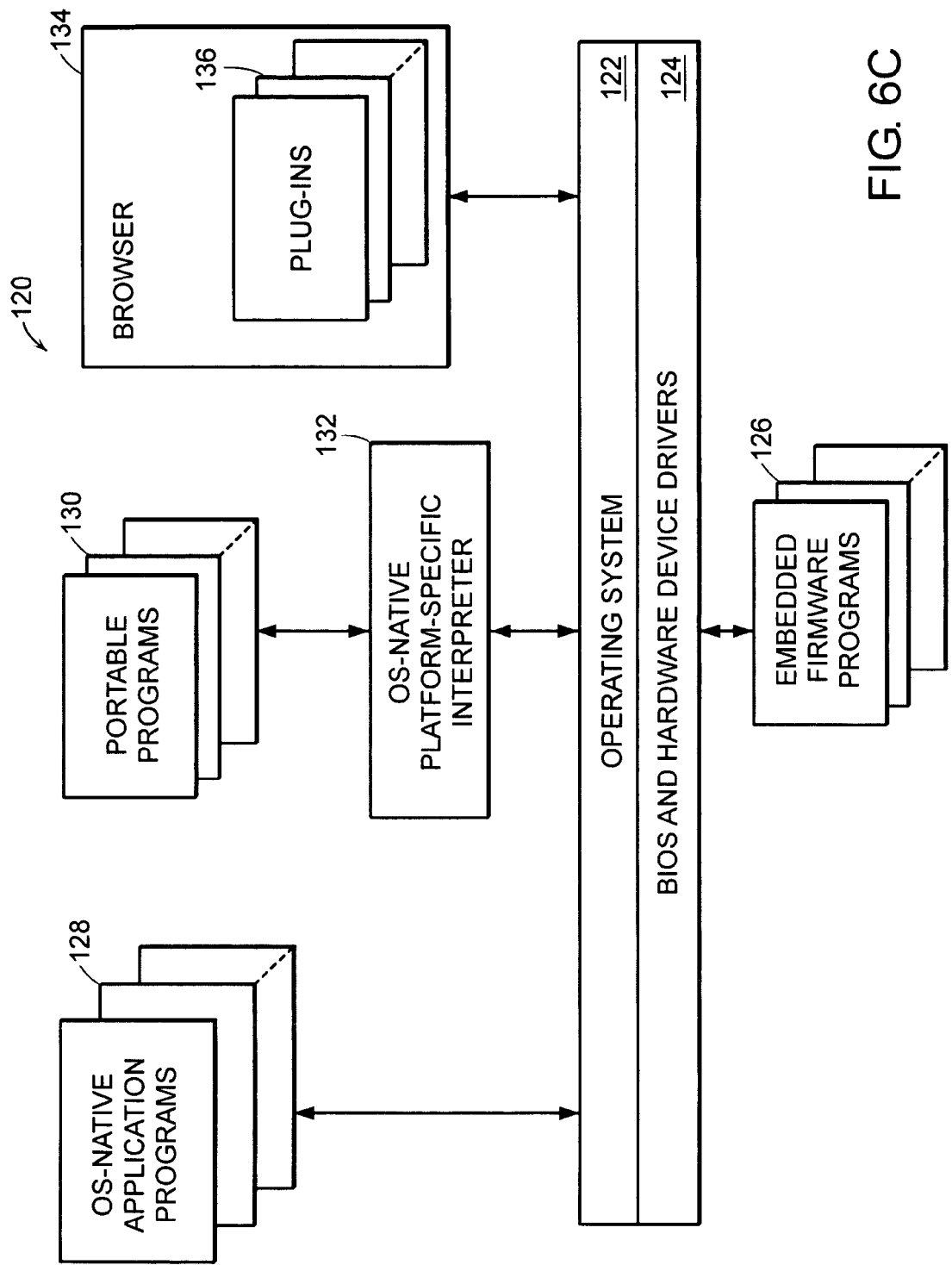

FIG. 6A illustrates electrical subsystem 20 which provides power and control for system 10 and may include an electrical panel 70, a computer 72 using software 74 and a network 78. Electrical panel 70 provides a central location for wiring and interfacing with system 10. Electrical panel may include power supply 50, fuses, circuit breakers, step-down transformers, line filtering, power supply monitoring, and breakouts or connections, for connecting other subsystems and modules requiring power. In addition, electrical panel 70 may contain data cable connections for portions of system 10 requiring machine-readable data. Computer 72 may consist of a general-purpose computing device configured to operate as a controller for system 10. Computer 72 is further described in conjunction with FIG. 6B and exemplary software is shown in FIG. 6C for performing functions necessary for operation of system 10.

FIG. 6B illustrates a generalized computing architecture that can be implemented in an Industrial Personal Computer (IPC) 72 executing custom software. IPC 72 includes a central processing unit 80 (CPU), which is typically comprised of a microprocessor 82 associated with random access memory (RAM) 86 and read-only memory (ROM) 88. Often, the CPU 80 is also provided with cache memory 84 and programmable FlashROM 90. The interface 92 between the microprocessor 82 and the various types of CPU memory is often referred to as a local bus, but also may be a more generic bus, an industry standard bus, or a customized bus. CPU 80 processes and interprets machine-readable, or function-executable, instructions associated with an operating system, user-developed applications, system diagnostic tools, and the like.

Computing platforms such as IPC 72 are also provided with one or more storage drives 96, such as hard-disk drives (HDD), floppy disk drives, compact disc drives (CD, CD-R, CD-RW, DVD, DVD-R, etc.), and proprietary disk and tape drives (e.g., Iomega Zip™ and Jaz™, Addonics SuperDisk™, etc.). The RAM 86 is capable of storing machine-readable instructions and information necessary to operate system 10.

IPC 72 may include one or more communication interfaces 98, according to the function intended of the computing platform. For example, a computing platform is often provided with a high speed serial port (RS-232, RS-422, etc.), an enhanced parallel port (EPP), and one or more universal serial bus (USB) ports. The computing platform may also be provided with a local area network (LAN) interface or network interface card (NIC), such as an Ethernet card, and other high-speed interfaces such as the High Performance Serial Bus IEEE-1394. The communication interface 98 may also support wireless communication protocols and may employ radio frequency (RF) signals or optical signals such as infrared data arrangement (IrDA).

IPC 72 may also be equipped with one or more internal expansion slots 100, such as Industry Standard Architecture (ISA), Enhanced Industry Standard Architecture (EISA), Peripheral Component Interconnect (PCI), or proprietary interface slots for the addition of other hardware, such as sound cards, memory boards, and graphics accelerators. IPC 72 may further be provided with one or more external expansion slots 102 allowing the user the ability to easily install and remove hardware expansion devices, such as PCMCIA cards, SmartMedia cards, and various proprietary modules such as removable hard drives, CD drives, and floppy drives. Often, storage drive 96, communication interfaces 98, internal expansion slots 100 and external expansion slots 102 are interconnected with CPU 80 via a standard or industry open bus architecture 94, such as ISA, EISA, or PCI. In many cases, the bus 94 may be of a proprietary architecture.

A computing platform for use with system 10 may further be provided with one or more user input devices, such as a keyboard or a keypad 110, and mouse or pointer device 112, and/or a touch-screen display 114. In the case of a personal computer, a full size keyboard is often provided along with a mouse or pointer device, such as a track ball or TrackPoint™. In the case of system 10, a simple keypad may be provided with one or more function-specific keys.

Additionally, a microphone 116 may be used for simply reporting audio and voice signals or commands to system 10. For example, microphone 116 can be used for entering user choices, such as recipes or for auto-dialing telephone numbers for technical support. IPC 72 can also be equipped with a camera device 118, such as a still digital camera or full motion video digital camera which can be used to document or monitor operation of system 10 or for creating training materials dealing with the use of system 10.

One or more user output devices, such as a display 104, are also provided with most computing platforms such as IPC 72. The display 104 may take many forms, including a Cathode Ray Tube (CRT), a Thin Flat Transistor (TFT) array, or a simple set of light emitting diodes (LED) or liquid crystal display (LCD) indicators.

One or more speakers 106 and/or annunciators 108 are often associated with computing platforms, too. The speakers 106 may be used to reproduce audio or music. Annunciators 108 may take the form of simple beep emitters or buzzers. These user input and output devices may be directly interconnected (94A, 94B) to the CPU 80 via a proprietary bus structure and/or interfaces, or they may be interconnected through one or more industry open buses such as ISA, EISA, PCI, etc.

IPC 72 is also provided with one or more software and firmware 120 programs to implement the desired functionality of the computing platforms used to control operation of system 10. Turning now to FIG. 6C, more detail is given of a generalized organization of software and firmware 120 on this range of computing platforms. One or more operating system (OS) native application programs 122 may be provided on IPC 72, such as word processors, spreadsheets, contact management utilities, address books, calendars, email clients, presentation, financial and bookkeeping programs, manufacturer supplied applications for operating system 10, etc. Additionally, one or more portable or device-independent programs 130 may be provided, which must be interpreted by an OS-native platform-specific interpreter 132, such as Java™ scripts and programs. IPC 72 may also be provided with a form of web browser or micro-browser 134, which may also include one or more extensions to the browser such as browser plug-ins 136.

IPC 72 may further be provided with an operating system 122, such as Microsoft Windows™, UNIX®, IBM OS/2™, or AIX®, LINUX, MAC OS™, Sun Solaris™, or other platform specific operating systems. Less sophisticated embodiments of IPC 72 may be equipped with other forms of operating systems such as real-time operating systems (RTOS). A set of basic input and output functions (BIOS) and hardware device drivers 124 are often provided to allow the operating system 122 and programs to interface to and control the specific hardware functions provided with the computing platform. Additionally, one or more embedded firmware programs 126 are commonly provided to be executed by onboard or "embedded" microprocessors as part of the peripheral device, such as a microcontroller or a hard drive, a communication processor, network interface card, or sound or graphics card.

As such, FIGS. 6B and 6C describe in a general sense the various hardware components, software and firmware programs of a wide variety of computing platforms that can be implemented as IPC 72 including, but not limited to, personal computers, workstations, servers, and other like appliances for controlling system 10 and for communicating with other devices over network 76. It will be readily recognized by those skilled in the art that the following methods and processes may be alternatively realized as hardware functions, in part or in whole, without departing from the spirit and scope of the invention. Table 2 lists specifications for an-exemplary embodiment of IPC 72.

TABLE 2

| IPC Specifications | Operator Interface Specifications |
|---|---|
| O/S-Windows 2000 Professional | Standard Keyboard 101 |
| CPU-800 MHz | Mouse-Optical Interface |
| RAM-256 MB | Display-15 inch flat screen |
| CD-ROM-52× read | |
| USB-4 port, high speed 2.0, 1 external mounted port | |
| NIC-10/100 Mbps, external mounted port | |
| Analog I/O Controller | |
| Digital I/O Controller | |
| Scanhead Controller | |

Returning to FIG. 6A, network 76 may be used for communicatively coupling system 10 to other devices such as central plant controllers, manufacturer support centers, inventory control centers, and the like. Network 76 may be any type of communications network running any networking protocol. For example, network 76 may be an intranet such as a local area network (LAN) operating within a corporate location or university campus, a metropolitan area network (MAN) operating within a geographic region such as a city and its surrounding suburbs, or a wide area network (WAN) such as the world wide web. In addition, network 76 may run any type of networking protocol such as, for example, transmission control protocol and Internet protocol (TCP/IP) asynchronous transfer mode (ATM), synchronous optical network (Sonet), frame relay, integrated services digital network (ISDN), and open shortest path first (OSPF). Network 76 may employ a plurality of links for coupling network elements and locations. Links may be comprised of hardwired links and/or wireless links. Examples of hardwired links are, but are not limited to, coaxial cable, twisted pair cable, and optical fibers and examples of wireless links are, but are not limited to, radio frequency (RF) such as IEEE 802.11 based links, or free space optical links.

Figure 7A:
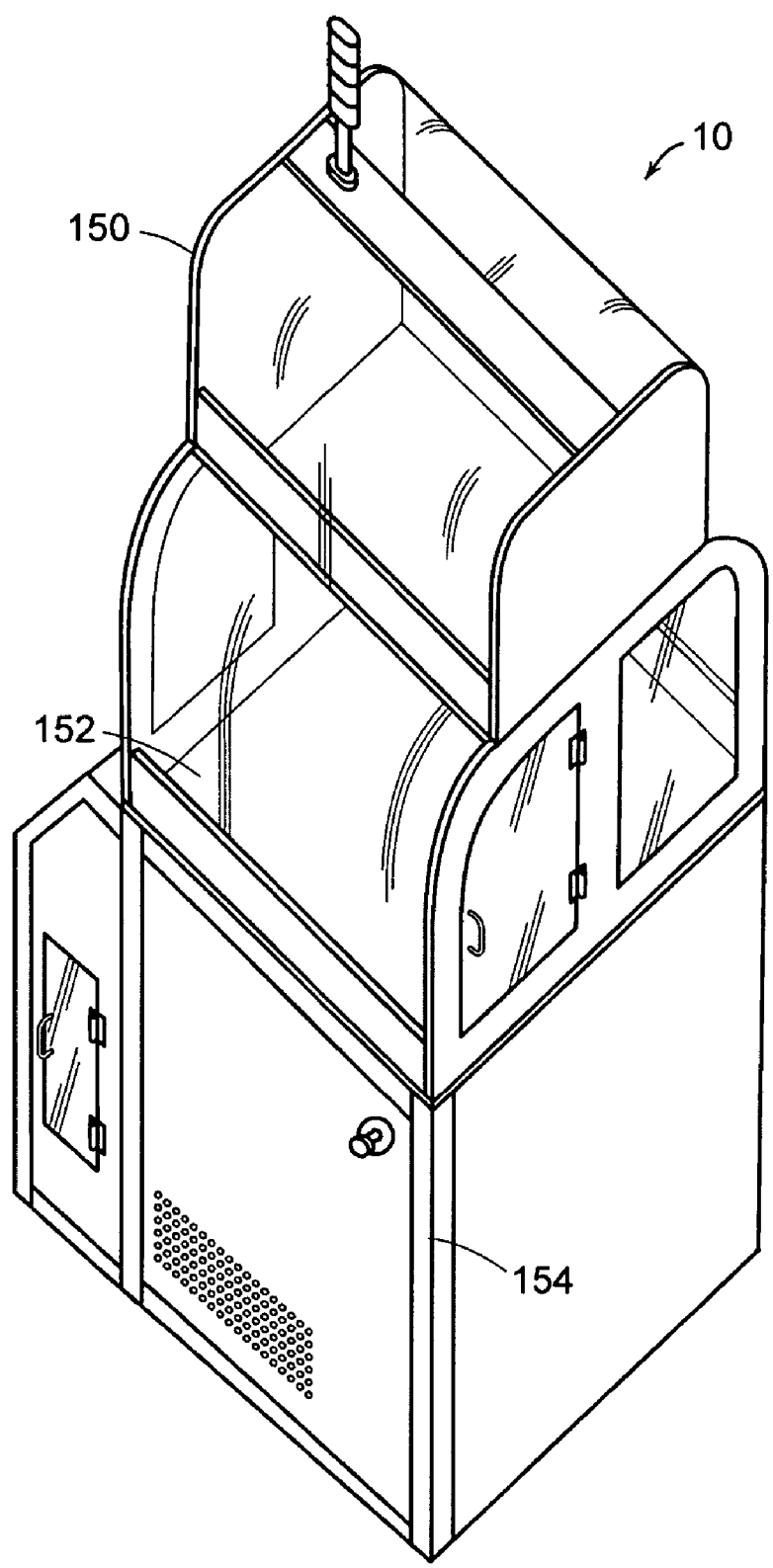
FIGS. 7A-7C illustrate embodiments of a system for cleaning wafers using optical radiation in accordance with aspects of a preferred embodiment of the invention.
Figure 7B:
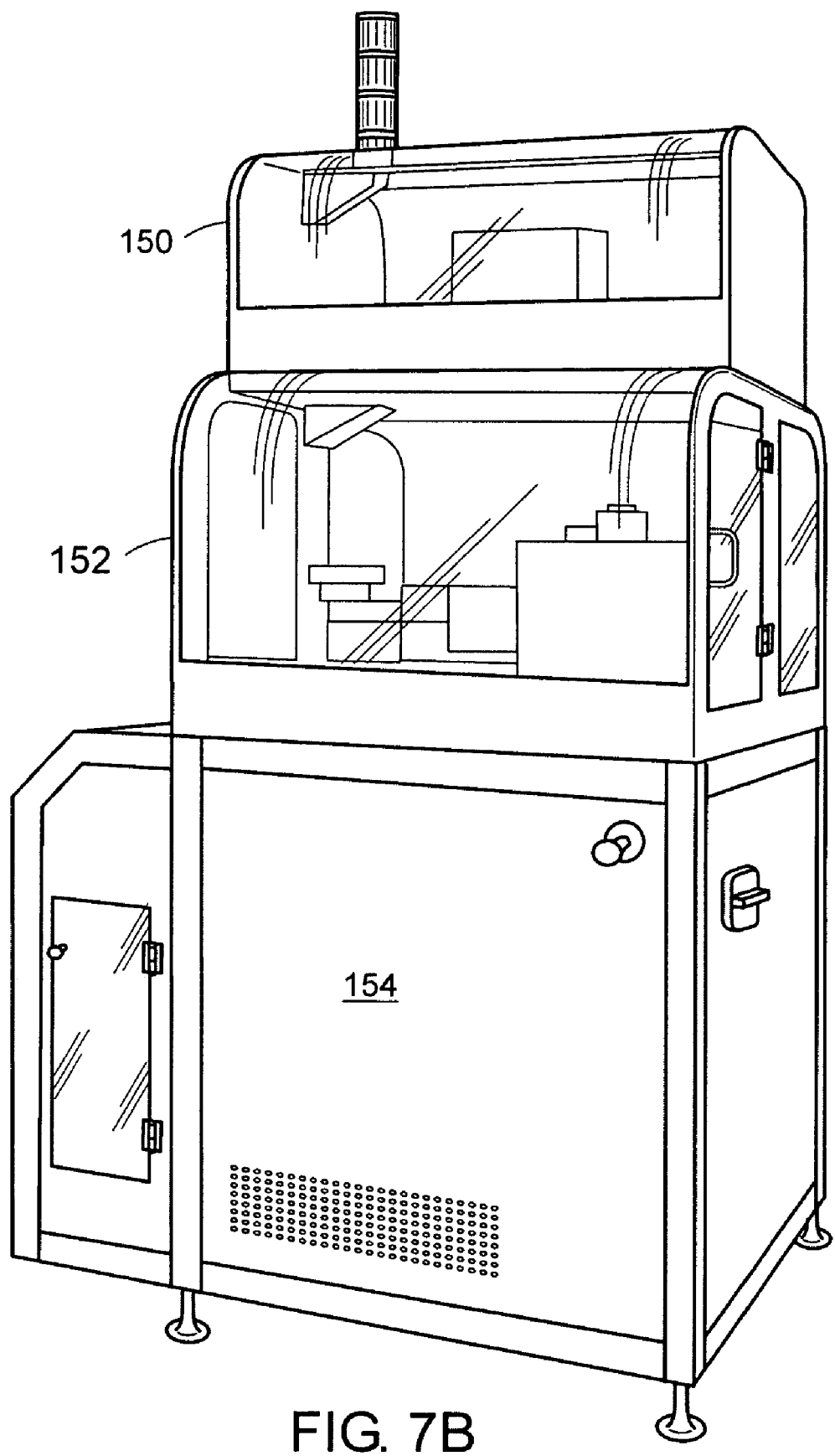
Figure 7C:
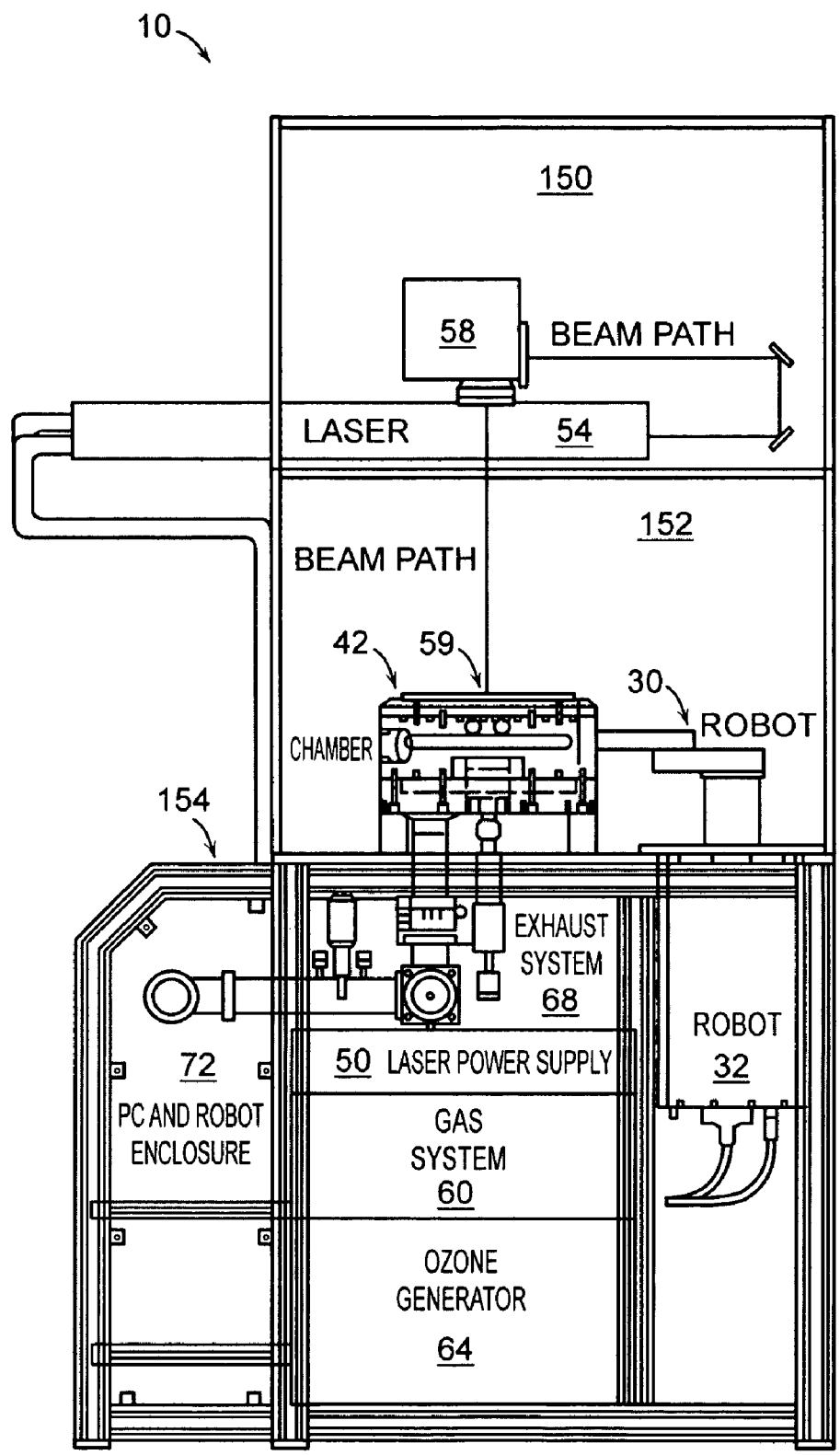

FIGS. 7A-7C illustrate embodiments of system 10 that can be used for cleaning wafer 26 using optical radiation. FIG. 7A illustrates a perspective view of a line drawing illustrating a general shape for system 10. The embodiment illustrated in FIG. 7A may generally have an upper enclosure 150 which may be used to house optical subsystem 16, a middle enclosure 152 which may be used to house components from handling subsystem 12 and reaction chamber 14 and a lower enclosure 154 which may be used to house electrical subsystem 20 and components of gas/exhaust subsystem 18. FIG. 7B contains a pictorial illustration of system 10 further showing upper enclosure 150, middle enclosure 152 and lower enclosure 154. The exterior of system 10 may be fabricated from any suitable material such as, for example, aluminum, stainless steel, plastic, composite, and wood. The material chosen lends itself to use in clean room environments and facilitates easy cleaning and does not contribute to excessive particles or other contaminants such as fumes.

FIG. 7C illustrates a side view of system 10 illustrating the location of subsystems and components described herein and housed within upper enclosure 150, middle enclosure 152 and base enclosure. Table 3 presents system specifications and parameters associated with a preferred embodiment of the invention as shown in FIGS. 7A-C.

TABLE 3

| Parameter | Specification |
|---|---|
| Length | 33 inches |
| Width | 42 inches |
| Height | 74 inches |
| Gross weight | 550 pounds est. |
| Laser wavelengths | 355 nm primary/532 nm residual |
| Laser pulse energy | <1 mJ |
| Laser repetition rate | 10 kHz |
| Gases | $O_2$, $O_3$, $H_2O$ vapor |
| Effluents | Gaseous $CO_2$, gaseous $H_2O$ |
| Chuck temperature | 100° C. |
| Gas flow | 5 slm |
| Chamber pressure | 50 Torr |
| Cleaning time per wafer | 3 minutes, recipe dependent |

In a preferred embodiment of the present invention, a gas mixture is employed that is optimized for a high concentration of atomic oxygen and hydroxyl radicals. Such a combination is useful for facilitating efficient combustion of carbonaceous layers such as photoresist thereby eliminating the need for follow-up wet chemical cleaning. The relative strength of exemplary known oxidizers is shown in Table 4.

TABLE 4

Relative Oxidizing Power of Oxidizing Species

| Species | Oxidation Potential (volts) | Ox Power Relative to Cl |
|---|---|---|
| F | 3.06 | 2.25 |
| OH | 2.80 | 2.05 |
| O | 2.42 | 1.78 |
| $O_3$ | 2.07 | 1.52 |
| $H_2O_2$ | 1.77 | 1.30 |
| Cl | 1.36 | 1.00 |

A typical simplified photochemical pathway for a reaction using an oxidizing agent in conjunction with optical energy in accordance with aspects of the invention is shown in equation 1 below.

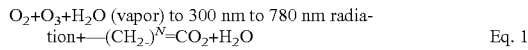

$$O_2 + O_3 + H_2O \text{ (vapor) to 300 nm to 780 nm radiation} + (CH_2)^N = CO_2 + H_2O \quad \text{Eq. 1}$$

The simplified photochemical mechanism of Eq. 1 possesses a significant oxidizing potential when compared to relevant methods of the prior art. The oxidizing potential is partially due to a high concentration of ozone combined with water vapor, which gives rise to an unusually high population of hydroxyl radicals. Further, the high laser pulse repetition rate of 1 kHz to 100 kHz provides a high speed low thermal content optical pumping mechanism which keeps the reacted by-products, containing carbon, from redepositing on the surface. The high repetition rate is coupled with a very low energy per pulse, such as 0.85 mJ. Prior art repetition rates range from 100 Hz to 500 Hz typically, and prior art pulse energies range from 50 mJ to 400 mJ/pulse typically. Prior art systems having lower pulse repetition rate lasers leave a carbon residue that requires follow-up wet cleaning.

The near-visible and visible wavelengths permit high concentrations of oxygen and ozone molecules to be used in the reaction due to low absorption coefficients. This enables a very high oxidation potential. Finally, the low photon energy of the near-visible and visible wavelength, typically 2.33 eV to 3.49 eV, permits the use of high incident fluence and peak power at the wafer plane without causing surface damage such as silicon roughening. Prior art photon energy ranges from 5.0 eV to 7.21 eV/photon.

The embodiments of the present invention use a low wafer temperature in the range of 20° C. to 120° C., compared to typically 200° C. to 300° C. for prior art methods. While higher temperatures in general create higher reaction rates, they also contribute to ozone destruction as well as damage to wafers as stresses and warpage.

As a result, the photochemical mechanism of the present invention leaves essentially no carbon residues, while prior art methods, both UV/gas and plasma/gas types, may leave residues sufficiently thick so as to require additional cleaning steps. Oxygen radicals in GRZ 31 of the preferred embodiment break down the photopolymer efficiently, taking the carbon away in the form of carbon dioxide. The GRZ also serves to combust all reaction by-products as they leave the wafer surface, providing secondary combustion to eliminate by-products from re-depositing on the wafer surface. The embodiment described operates at essentially an atmospheric pressure of 50 Torr; however it has been operated at pressures as high as 760 Torr, in addition, embodiments may be operated at positive pressures. After cleaning a wafer 26 with a preferred embodiment of the invention, X-ray Photoelectron Spectroscopy (XPS) analysis of the carbon remaining after resist removal was performed and the amounts remaining at 50 Torr were within 3-4 Å of the sample when the chamber pressure was set at 700 Torr. In preferred embodiments of the invention, on the order of ~3.2 Å of carbon remained after cleaning. In contrast, experiments done using prior art techniques employing short wavelength UV radiation, oxygen, ozone, and alcohol method for polymer removal left films on the order of 21 Å thick after cleaning. By way of example, Table 5 shows the amount of carbon remaining using a 193 nm UV laser test conducted using techniques and procedures as taught in the prior art.

TABLE 5

| Substrate | Gas | Remaining Carbon (Å) |
|---|---|---|
| Control | None | 2 |
| Silicon with resist | 50/50 $N_2O$ | 38 |
| Silicon with resist | 250 ppm $O_3/O_2$ | 35 |
| Silicon/implant resist | 250 ppm $O_3/O_2$ | 21 |

As shown by the mechanisms disclosed by way of Eq. 1 the photochemical pathways of the present invention operate to remove photoresist coatings or layers while using wavelengths that are largely transparent in the gas. The combination of the near-visible and visible radiation and highly concentrated ozone with water vapor is believed to create a fundamentally different photochemical mechanism from the prior art. For example, laser pulse energies of embodiments of the invention are ~1/100 of those typically used in prior art, and the photon energy of the present invention is ~½ that of the prior art. The reduced role of the radiation, and increased role of the gas chemistry, permits a more efficient mechanism to completely react organics without the risks of damage associated with high power, short wavelength UV sources.

Figure 8A:
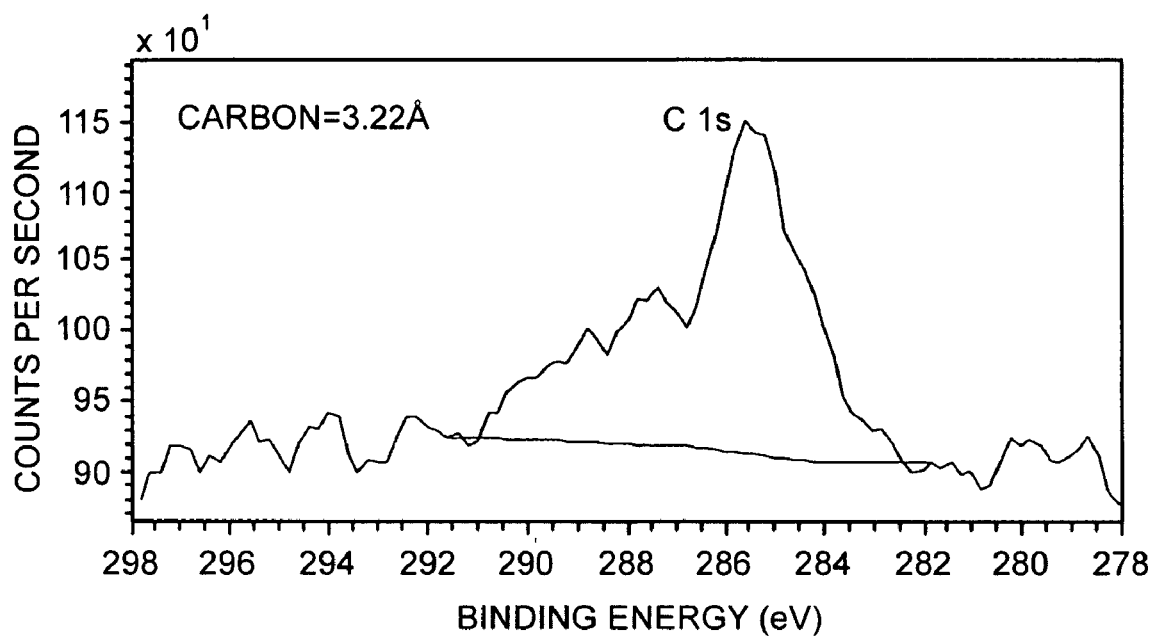
FIGS. 8A and 8B illustrate the results of an XPS analysis showing carbon remaining after cleaning using an embodiment of the invention.
Figure 8B:
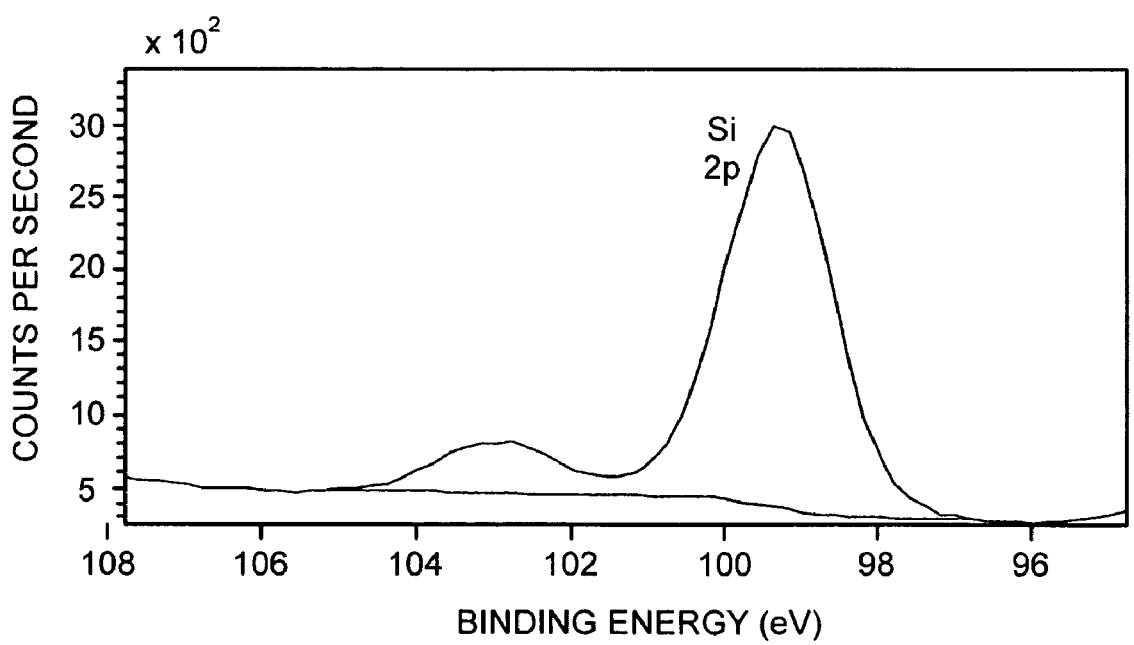
Figure 8C:
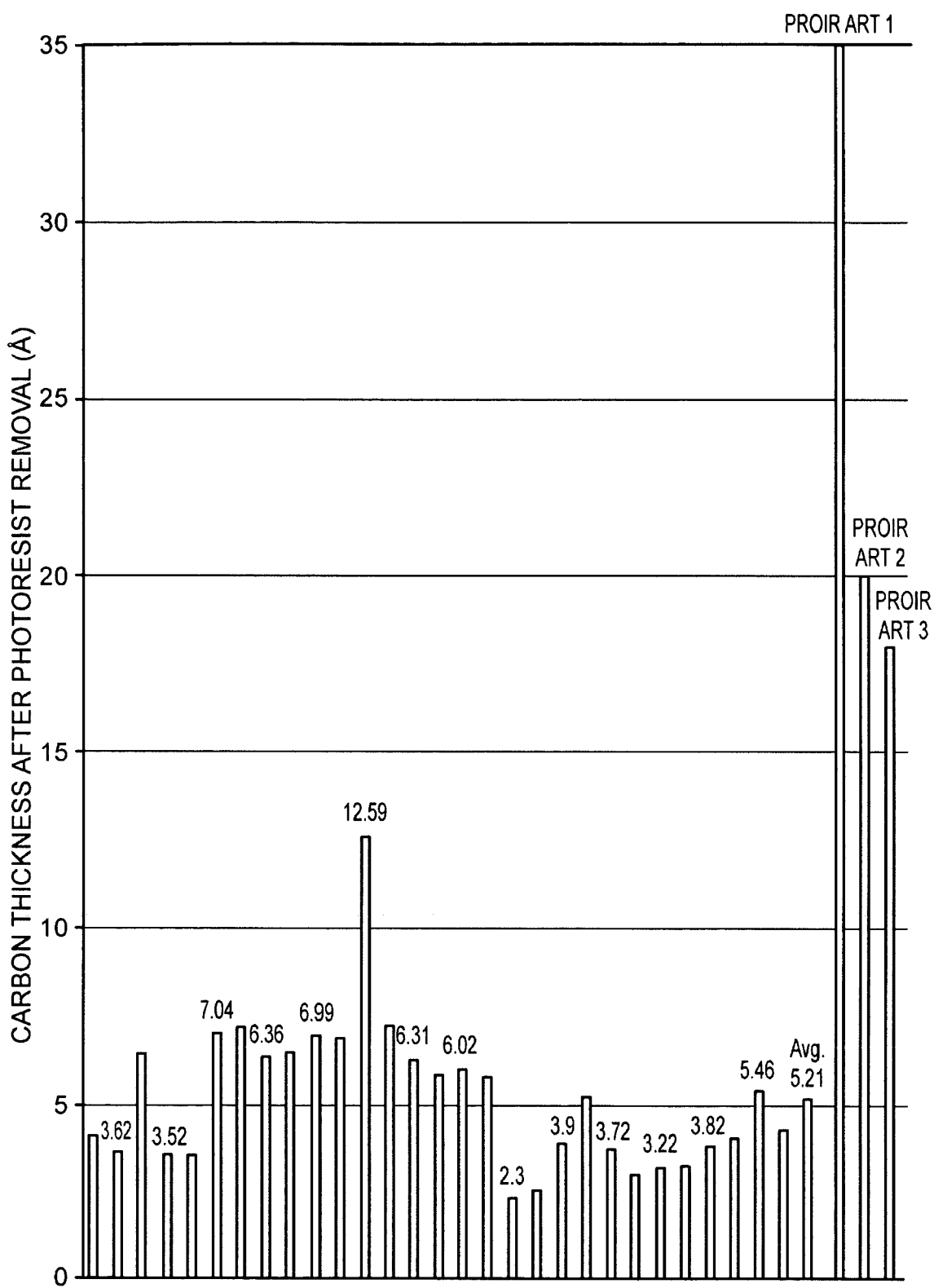
FIG. 8C illustrates various thicknesses of carbon remaining after photoresist removal using optical radiation, the data in the figure show results obtained using embodiments of the invention and results obtained using prior art methods.

FIGS. 8A and 8B illustrate raw XPS (X-ray Photoelectron Spectroscopy) data for a cleaning analysis performed using a preferred embodiment of the invention. The XPS method determines the amount of carbon remaining on a surface after photoresist removal. FIG. 8C shows the plotted average carbon level remaining to be ~3.2 Å. Measurements below this amount were not readily achievable because the detectability limit of the instruments used to perform the measurement was on the order of 3 Å. Alongside the present invention data are shown three plots of prior art carbon results done with a typical short wavelength UV laser and gas cleaning system.

Figure 9A:
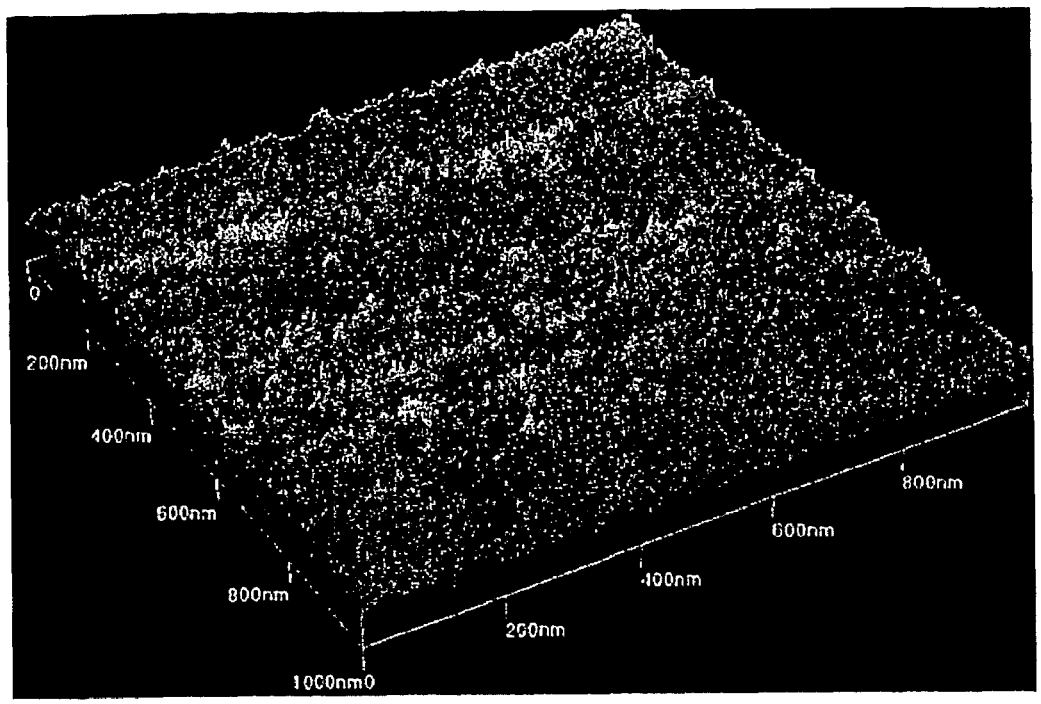
FIGS. 9A and 9B show atomic force microscope images of silicon wafer surfaces before and after photoresist removal using embodiments of the invention, respectively.
Figure 9B:
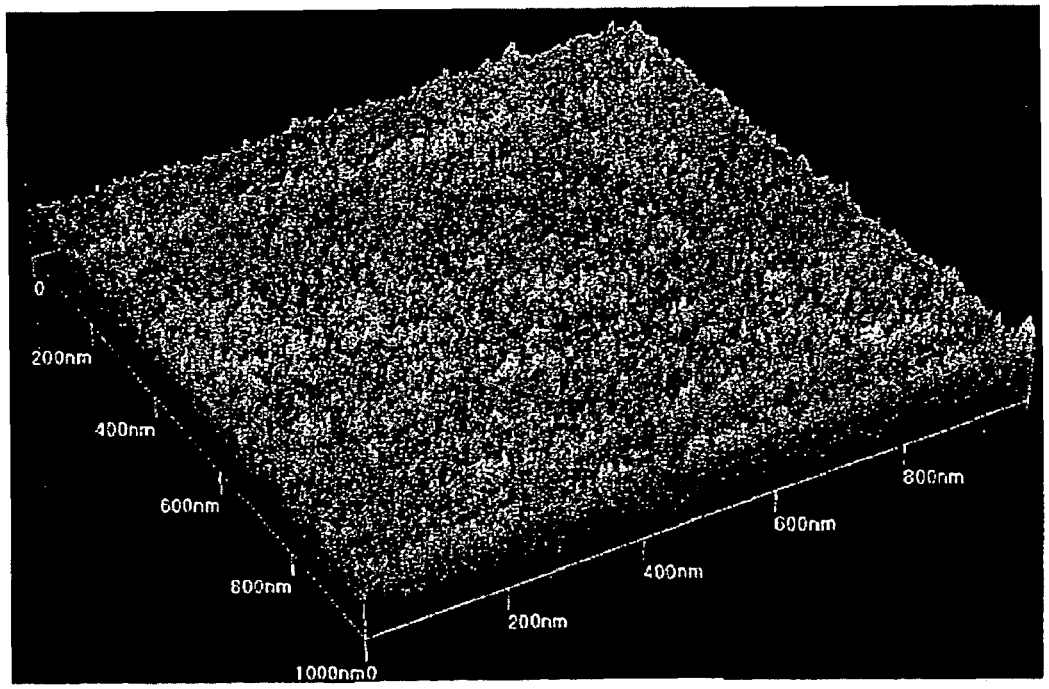
Figure 9C:
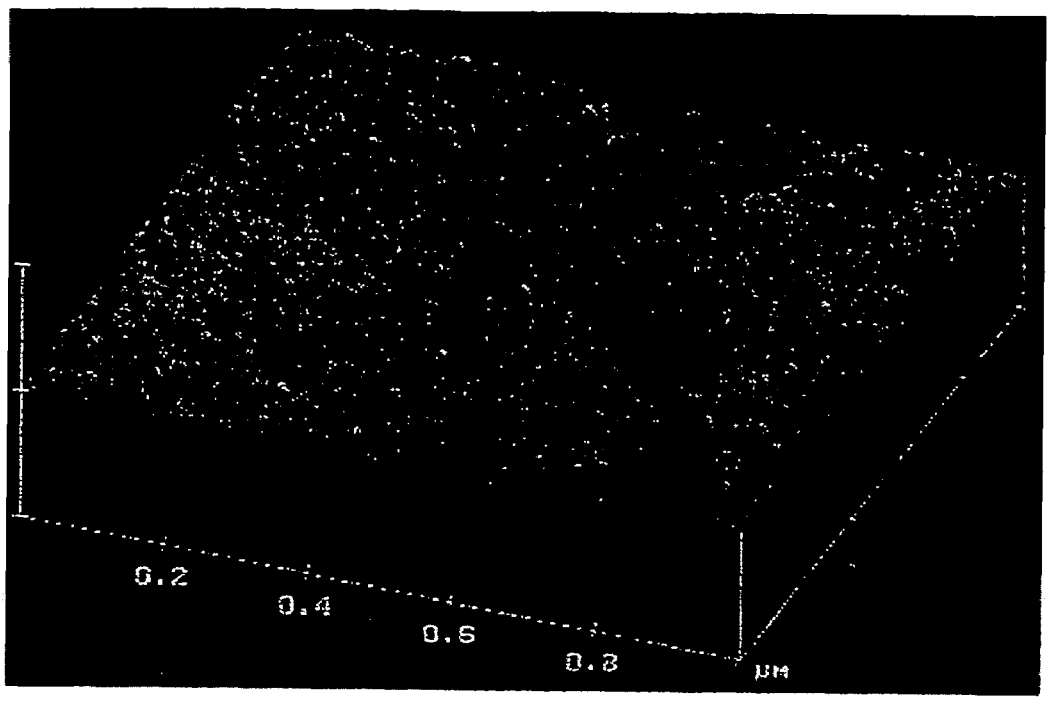
FIGS. 9C and 9D show atomic force microscope images of silicon wafer surfaces before and after photoresist removal using a prior art method.
Figure 9D:
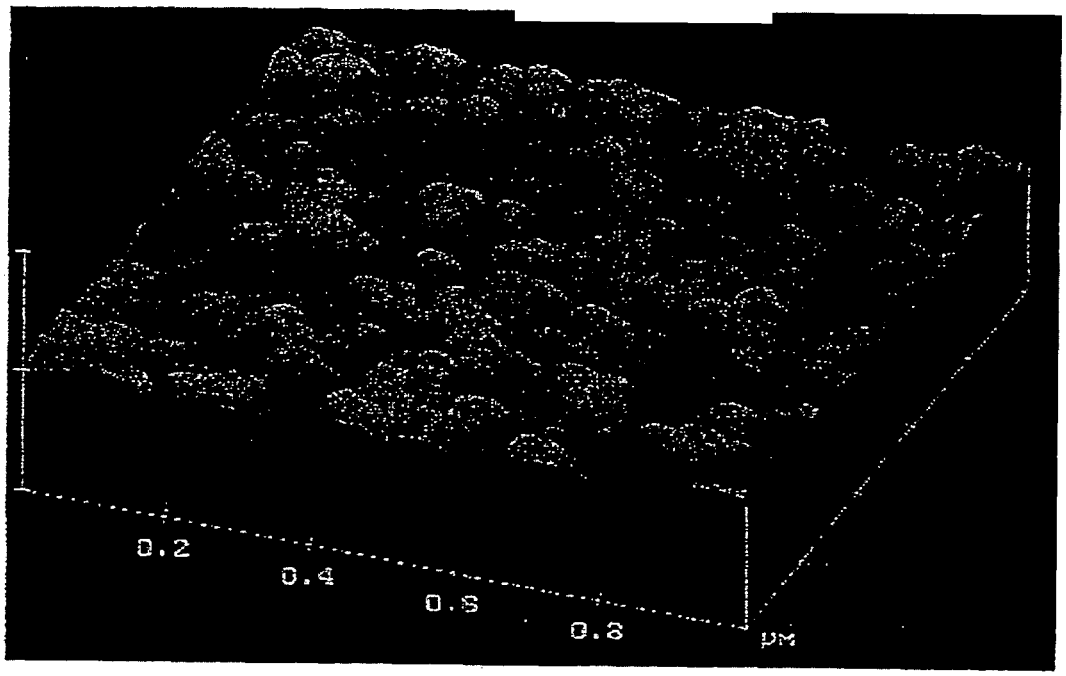

FIGS. 9A-9D show four Atomic Force Microscope (AFM) photographs of wafers before and after photoresist removal both with the method and system of the present invention (FIG. 9B) and prior art examples (FIGS. 9C and D) which served as controls for evaluating improvement gains achieved using embodiments of the invention. The AFM measures the surface condition of the silicon wafer at the atomic level. The data shows that the control sample of FIG. 9A before cleaning has an RMS value of 2.3 Å, while the cleaned sample, using an embodiment of the invention, shown in FIG. 9B has an RMS value of 2.5 Å. As shown by the comparison of the control surface of FIG. 9A and the surface cleaned using the invention in FIG. 9B, the surface of the wafer is unaffected by the cleaning process. In contrast, FIG. 9C shows a substrate before it was cleaned using a UV technique and FIG. 9D shows the same substrate after cleaning using a prior art photoresist removal method. The prior art photoresist removal method caused ~86 Å of surface roughness.

Figure 10A:
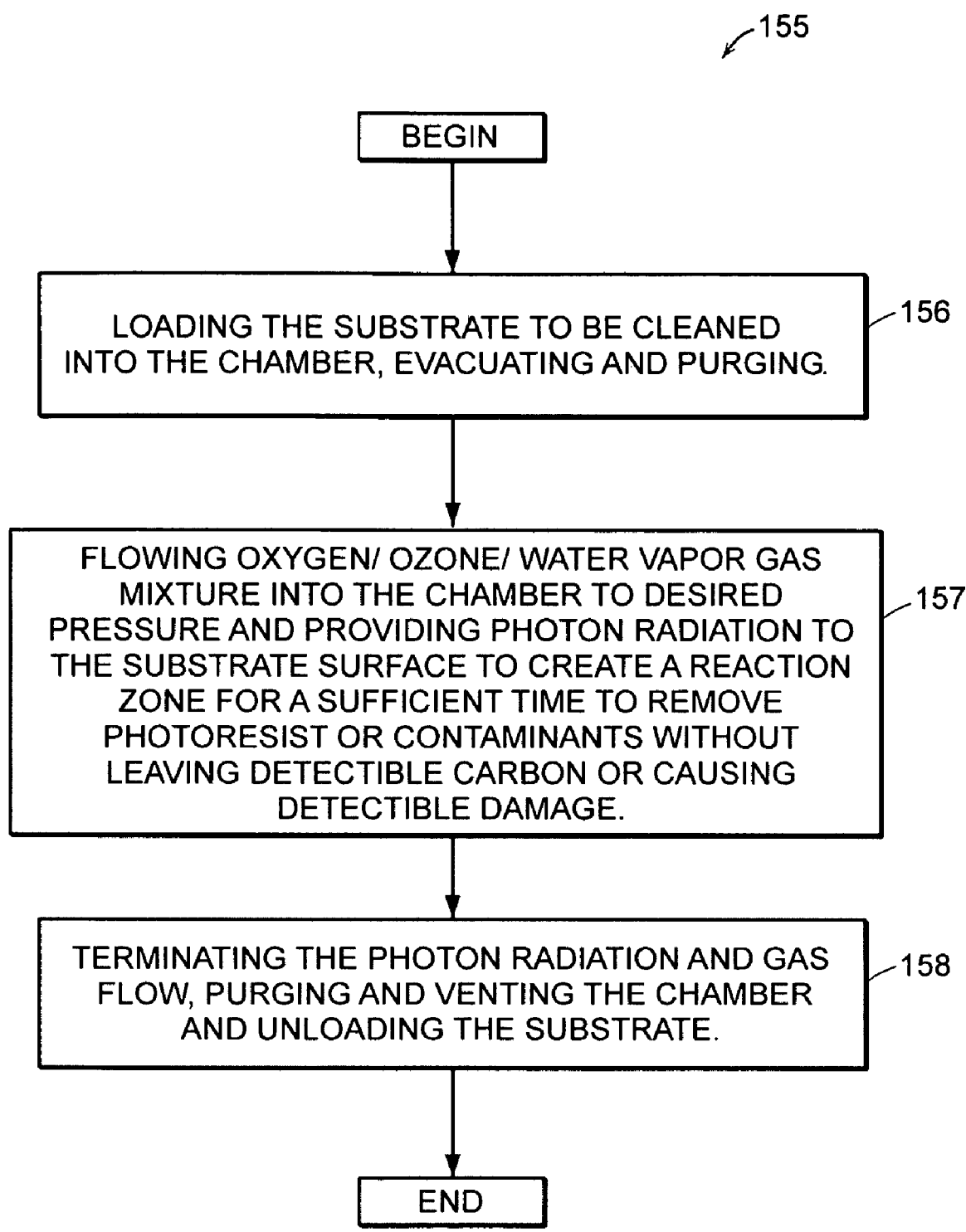
FIGS. 10A-10C illustrate exemplary flow diagrams depicting methods of practicing a preferred embodiment of the present invention.
Figure 10B:
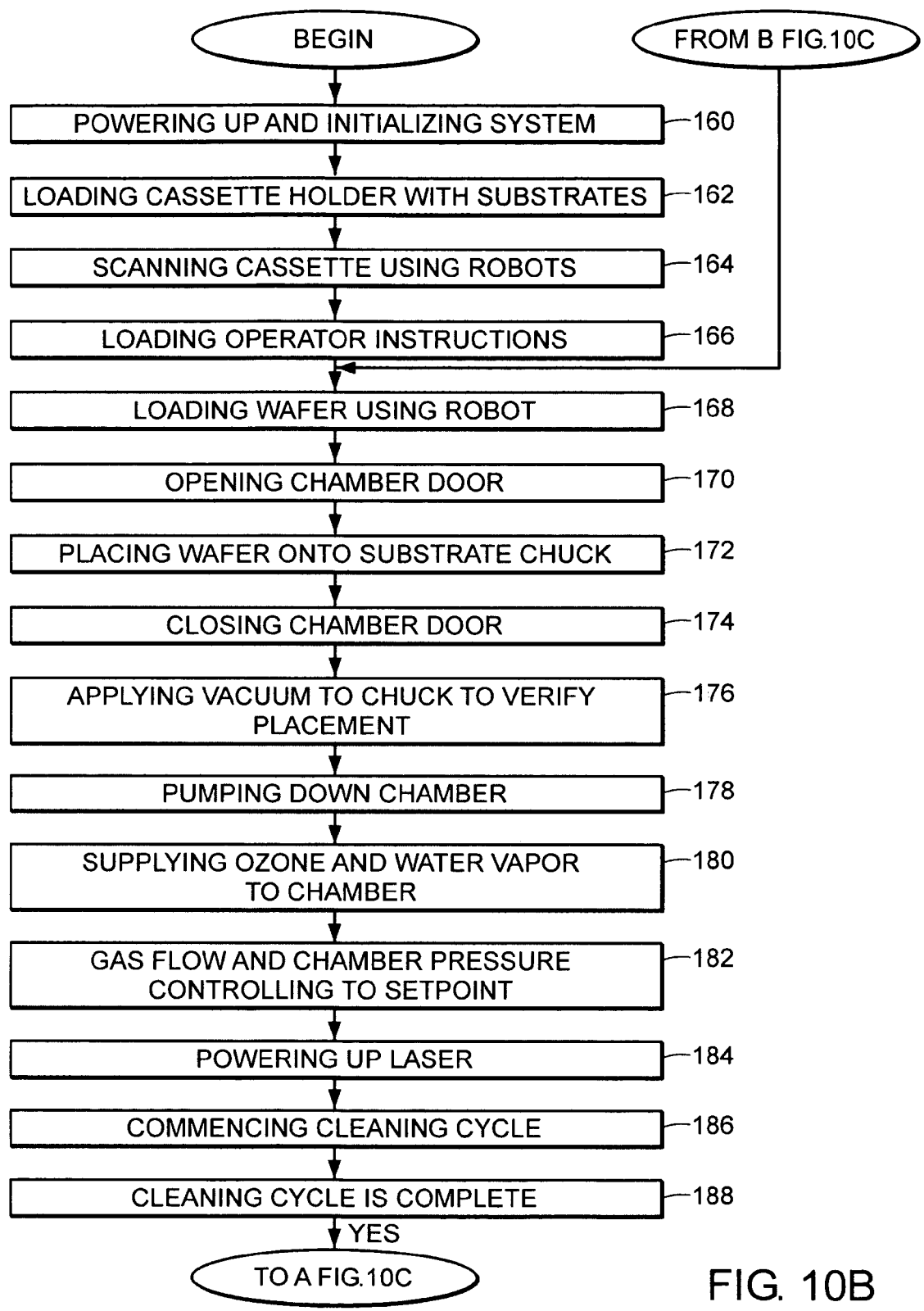
Figure 10C:
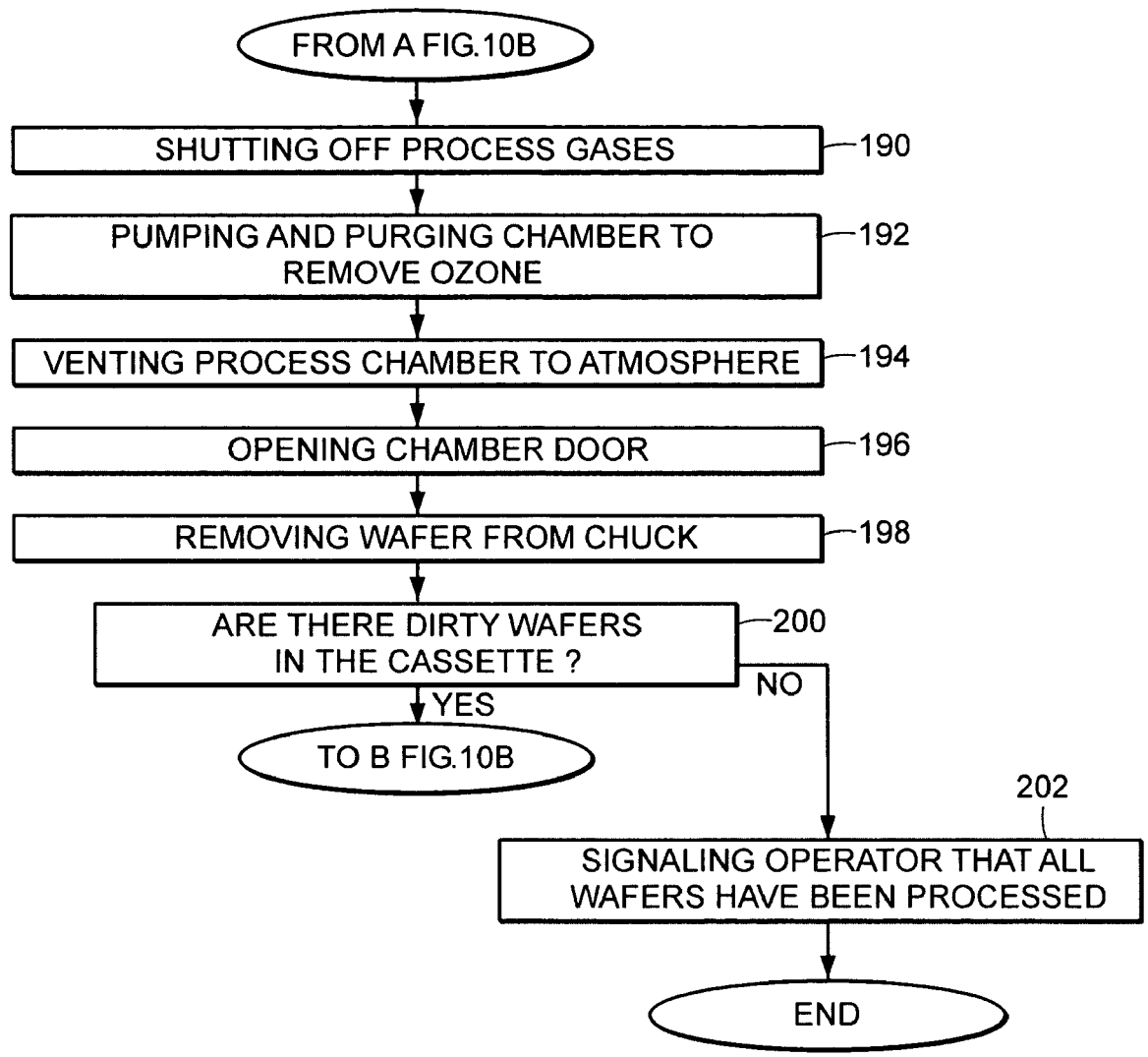

FIGS. 10A-10C illustrate an exemplary method for removing organic deposits from a wafer 26 using optical radiation in accordance with aspects of the invention. FIG. 10A provides a high level description of a preferred method for cleaning substrates in accordance with aspects of the invention.

The method 155 begins when a substrate to be cleaned is loaded into the chamber. After the substrate is loaded, the chamber is purged (per step 156). A mixture of oxygen/ozone/water vapor gas is allowed to flow into the chamber until a desired pressure is reached. Then photon radiation is provided to the substrate to create a reaction zone for a time interval sufficient to remove photoresist or contaminants without leaving detectible carbon or causing detectable damage (per step 157). The gas reaction zone may include hydrogen, hydrogen peroxide or another hydrogen containing gas. Photon radiation and gas flow are terminated and the chamber is purged and vented. Then the substrate is unloaded (per step 158).

In accordance with FIGS. 10B and 10C, the system 10 is turned on and initialized per step 160. A cassette is then loaded with multiple wafers 26 to be cleaned per step 162. A robot scans the cassette and determines the number and/or type of wafers to be cleaned per step 164. Instructions for the particular cleaning cycle are then loaded by way of operator inputs or instructions read from memory per step 166. A wafer 26 is loaded using robot 30 per step 168. A door on a sealable reaction chamber 14 is opened per step 170 and wafer 26 is placed onto a substrate chuck 44, which may further be capable of heating the wafer 26 while positioned thereon per step 172. The chamber door is then closed per step 174. A vacuum is applied to the wafer to verify proper wafer placement on the chuck 44 per step 176. A wafer centering ring or other means known in the art retains the wafer on the chuck during processing once the wafer chuck vacuum sensor is turned off prior to commencing the cleaning cycle. Reaction chamber 14 is then pumped down to a desired pressure per step 178.

Next, water vapor from water vapor module 62 and ozone from ozone generator 64 are combined in the delivery line and introduced into the chamber per step 180. A measurement is made to ensure gas flow and pressure control set-points are met per step 182. Once gas flow and pressure within the chamber are stable, the laser 54 is powered on per step 184. A cleaning cycle is then commenced using optical radiation operating in conjunction with the gas environment within the reaction chamber 14 to remove organic deposits from the surface of the wafer 26 per step 186. A check is then made to determine if the cleaning cycle has completed per step 188.

Now referring to FIG. 10C, once the cleaning cycle is completed, the process gases of water vapor and ozone are turned off per step 190. The reaction chamber is then pumped and purged with nitrogen to remove any introduced gases along with any airborne contaminants produced by the cleaning process per step 192. The chamber is then vented to atmosphere per step 194. The chamber door is then opened per step 196 and robot 30 removes the wafer 26 from the chuck 44 and returns it to cassette 34 per step 198. System 10 then determines if there are additional uncleaned wafers 26 in cassette 34 per step 200. If additional uncleaned wafers 26 are present in cassette 34, the method returns to the input of step 168 of FIG. 10B by way of path B. In contrast, if no uncleaned wafers 26 remain in cassette 34, the method signals an operator that the cleaning session has been completed as all uncleaned wafers 26 have been processed per step 202.

Several preferred embodiments have been described hereinbefore; however, the embodiments of the invention are not limited thereto as numerous alternative embodiments are possible in light of the teachings herein without departing from the spirit and scope of the invention.

By way of example, a first alternative embodiment may employ wavelengths between 250 nm and 300 nm removing photoresist and contaminants from substrates. In particular, a 266 nm optical wavelength may be generated using the fourth harmonic of a YAG laser. The YAG laser may be gated at a repetition rate of several kHz, for example 1 kHz to 100 kHz, and an ozone level of approximately 10% by weight. A substrate being cleaned in the above example may be operated on at room temperature and near atmospheric pressure, or the substrate may be heated to a temperature of approximately 100° C. and/or a pressure of 90 Torr to 100 Torr.

In a second alternative embodiment, one or more systems 10 may be portable. A portable, transportable substrate cleaning center may be utilized by semiconductor fabrication facilities requiring temporary additional substrate cleaning capacity. Another embodiment may include one or more systems being installed in a cluster tool to integrate the cleaning step with other process steps in a single automated system.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams. While various elements of the preferred embodiments have been described as being implemented in software, other embodiments in hardware or firmware implementations may alternatively be used, and vice-versa.

It will be apparent to those of ordinary skill in the art that methods involved in the system and method for determining and controlling contamination may be embodied in a computer program product that includes a computer usable medium. For example, such a computer usable medium can include a readable memory device, such as, a hard drive device, a CD-ROM, a DVD-ROM, or a computer diskette, having computer readable program code segments stored thereon. The computer readable medium can also include a communications or transmission medium, such as, a bus or a communications link, either optical, wired, or wireless having program code segments carried thereon as digital or analog data signals.

The claims should not be read as limited to the described order or elements unless stated to that effect. Therefore, all embodiments that come within the scope and spirit of the following claims and equivalents thereto are claimed as the invention.

What is claimed:

1. A method for cleaning a substrate, the method comprising:
providing a substrate to a cleaning chamber, where the substrate includes contamination on an upper surface thereof;
introducing a gas mixture to the cleaning chamber at a substantially constant flow rate, where the introducing comprises:
providing a first flow at a rate of 4 liters per minute to 15 liters per minute, where the first flow includes ozone at a concentration in a range of 6.9% to 14.3% by volume and where the first flow includes oxygen,
providing a second flow at a rate of 0.25 liters per minute, where the second flow includes water vapor, and
wherein the first flow and the second flow cooperatively form the gas mixture in the cleaning chamber;
providing laser radiation to the contamination via a solid state laser having an output wavelength of 355 nanometers (nm), a pulse energy in a range of 0.55 milli-Joules (mJ) to 0.99 mJ, and a pulse repetition rate in a range of 1 kilo-Hertz (kHz) to 100 kHz;
maintaining the substrate at a temperature in a range of 20 degrees centigrade (° C.) to 120° C. while the contamination is exposed to the laser radiation in the cleaning chamber; and
maintaining the cleaning chamber at a pressure in a range of 5 Torr to 760 Torr while the contamination is exposed to the laser radiation in the cleaning chamber,
wherein the introducing the gas mixture and the providing laser radiation causes the contamination from the upper surface of the substrate to be removed, leaving the upper surface of the substrate substantially free of damage and substantially free of contamination.

2. The method of claim 1, wherein the introducing the gas mixture, the providing laser radiation, the maintaining the substrate, and the maintaining the cleaning chamber result in a root mean square (RMS) deviation on the order of 2.47 angstroms (Å) for the upper surface when the upper surface is substantially free of contamination.

3. The method of claim 1, wherein the introducing the gas mixture, the providing laser radiation, the maintaining the substrate, and the maintaining the cleaning chamber results in approximately 3.27 angstroms (0) of carbon remaining on the upper surface of the substrate after the substrate is cleaned.

4. The method of claim 1, further comprising:
evacuating an exhaust gas after a portion of the contamination is removed, where the exhaust gas is free of hazardous or toxic by-products.

5. The method of claim 1, further comprising:
scanning the laser radiation across the upper surface to facilitate removal of the contamination from substantially the entire upper surface.

6. The method of claim 1, further comprising:
controlling the method for cleaning using a controller.

7. A method for cleaning a substrate in a cleaning chamber by removing residue from a surface of the substrate via a chemical reaction in a presence of illumination from a solid-state laser, where the chemical reaction causes the residue to change from a solid state to a gas state, the method comprising:
maintaining the substrate at a temperature in range of 20 degrees centigrade (° C.) to 120° C. in the cleaning chamber;
introducing a gas mixture comprising ozone, oxygen, and water vapor to the cleaning chamber; and
illuminating the residue with a solid state laser having a pulse energy of less than 0.99 milli-Joules per pulse to expose a portion of the residue to the gas mixture to cause the residue to change from the solid state to the gas state, allowing for removal of the residue from the substrate.

8. The method of claim 7, wherein the introducing the gas mixture further comprises:
introducing ozone in a concentration of 10% to 15% by volume.

9. The method of claim 7, wherein the illuminating further comprises:
illuminating the residue with a solid-state laser having an output wavelength in a range of 355 nanometers (nm) to 532 nm.

10. The method of claim 9, wherein the method further comprises:
scanning the illumination across the surface of the substrate.

11. The method of claim 9, wherein the method further comprises:
focusing the illumination on a plane above the surface of the substrate.

12. The method of claim 11, wherein the illuminated plane is a surface of the residue.

13. The method of claim 9, wherein the illuminating does not substantially raise a temperature of the substrate.

14. A method for photochemcially removing residue from a substrate in a cleaning chamber without substantially damaging the substrate, the method comprising:
maintaining the substrate at a temperature in a range of about 20 degrees centigrade (° C.) to about 120° C. within the cleaning chamber;
illuminating a surface of the substrate in the cleaning chamber with pulsed illumination having a pulse energy ranging from about 0.55 milli-Joules to about 0.99 milli-Joules per pulse and a wavelength in a range of about 300 nanometers (nm) to about 532 nm; and
introducing a gas mixture to the cleaning chamber comprising oxygen and ozone having a concentration in a range of about 10% to 15% by volume, the ozone being substantially non-absorbing with respect to the illumination wavelength and the ozone configured to chemically react with an illuminated portion of the residue to cause the illuminated portion to change state via a chemical reaction to remove the residue from the substrate without substantially damaging the substrate.

15. The method of claim 14, further comprising:
providing the illumination via a solid-state laser.

16. The method of claim 14, further comprising:
maintaining the cleaning chamber at a pressure in a range of 5 Torr to 760 Torr.

17. A method for photochemically removing residue from a substrate using a portable cleaning system, the method comprising:
maintaining a substrate at a temperature in a range of about 20 degrees centigrade (° C.) to about 120° C. while in a cleaning chamber of the portable cleaning system;
illuminating a surface of the substrate in the cleaning chamber with pulsed illumination having a wavelength in a range of about 300 nanometers (nm) to about 532 nm and a pulse energy of less than 0.99 milli-Joules per pulse; and introducing a gas mixture comprising oxygen and ozone to the cleaning chamber, the ozone having a concentration substantially in a range of 10% to 15% by volume, the ozone chemically reacting with an illuminated portion of the residue to cause the illuminated portion to change state a via a chemical reaction to remove the residue from the substrate.

18. A method for cleaning a substrate, the method comprising:

providing a substrate to a cleaning chamber, where the substrate includes contamination on an upper surface thereof, and cleaning substantially all of the contamination from the upper surface of the substrate using ozone and laser radiation from a solid state laser having a pulse energy of less than 1.0 milli-Joules at a wavelength ranging from about 355 nanometers (nm) to 532 nm, while maintaining the substrate at a temperature ranging from about 20 degrees centigrade (° C.) to about 120° C.

* * * * *